US011335604B2

(12) United States Patent
Cheng et al.

(10) Patent No.: US 11,335,604 B2
(45) Date of Patent: May 17, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Chao-Ching Cheng, Hsinchu (TW); I-Sheng Chen, Taipei (TW); Hung-Li Chiang, Taipei (TW); Tzu-Chiang Chen, Hsinchu (TW); Kai-Tai Chang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 216 days.

(21) Appl. No.: 16/426,552

(22) Filed: May 30, 2019

(65) Prior Publication Data

US 2020/0135587 A1    Apr. 30, 2020

Related U.S. Application Data

(60) Provisional application No. 62/753,898, filed on Oct. 31, 2018.

(51) Int. Cl.
*H01L 21/8238* (2006.01)
*H01L 29/78* (2006.01)
(Continued)

(52) U.S. Cl.
CPC ............... *H01L 21/823821* (2013.01); *H01L 21/02532* (2013.01); *H01L 21/306* (2013.01); *H01L 21/823828* (2013.01); *H01L 21/823878* (2013.01); *H01L 27/0924* (2013.01); *H01L 29/0649* (2013.01); *H01L 29/165* (2013.01); *H01L 29/66545* (2013.01); *H01L 29/66795* (2013.01); *H01L 29/785* (2013.01)

(58) Field of Classification Search
CPC ....... H01L 21/823821; H01L 21/02532; H01L 21/306; H01L 21/823828;
(Continued)

(56) References Cited

U.S. PATENT DOCUMENTS 9,236,267 B2    1/2016   De et al.
9,502,265 B1    11/2016  Jiang et al.
(Continued)

FOREIGN PATENT DOCUMENTS

KR    10-2006-0022414 A    3/2006
KR         101709400 B1    2/2017
(Continued)

*Primary Examiner* — Ori Nadav
(74) *Attorney, Agent, or Firm* — McDermott Will & Emery LLP

(57) ABSTRACT

In a method of manufacturing a semiconductor device, a fin structure having a lower fin structure and an upper fin structure disposed over the lower fin structure is formed. The upper fin structure includes first semiconductor layers and second semiconductor layers alternately stacked. The first semiconductor layers are partially etched to reduce widths of the first semiconductor layers. An oxide layer is formed over the upper fin structure. A sacrificial gate structure is formed over the upper fin structure with the oxide layer. A source/drain epitaxial layer is formed over a source/drain region of the fin structure. The sacrificial gate structure is removed to form a gate space. The oxide layer is removed to expose the second semiconductor layers in the gate space. A gate structure is formed around the second semiconductor layers in the gate space.

20 Claims, 27 Drawing Sheets

(51) Int. Cl.
  *H01L 27/092* (2006.01)
  *H01L 29/165* (2006.01)
  *H01L 29/66* (2006.01)
  *H01L 21/306* (2006.01)
  *H01L 29/06* (2006.01)
  *H01L 21/02* (2006.01)

(58) Field of Classification Search
  CPC ......... H01L 21/823878; H01L 27/0924; H01L 29/0649; H01L 29/165; H01L 29/66545; H01L 29/66795; H01L 29/785
  USPC .......................................................... 257/401
  See application file for complete search history.

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 10,014,390 | B1 | 7/2018 | Bouche et al. |
| 2006/0049429 | A1 | 3/2006 | Kim et al. |
| 2015/0270340 | A1 | 9/2015 | Frank et al. |
| 2016/0240652 | A1* | 8/2016 | Ching ............... H01L 29/42392 |
| 2017/0104061 | A1* | 4/2017 | Peng ................. H01L 29/42392 |
| 2017/0236937 | A1 | 8/2017 | Balakrishnan et al. |
| 2018/0175214 | A1 | 6/2018 | Chen et al. |

FOREIGN PATENT DOCUMENTS

| | | |
|---|---|---|
| KR | 20180069696 A | 6/2018 |
| TW | 201701359 A | 1/2017 |
| TW | 201724278 A | 7/2017 |
| TW | 201732894 A | 9/2017 |
| TW | 201735268 A | 10/2017 |
| TW | 201820634 A | 6/2018 |

\* cited by examiner

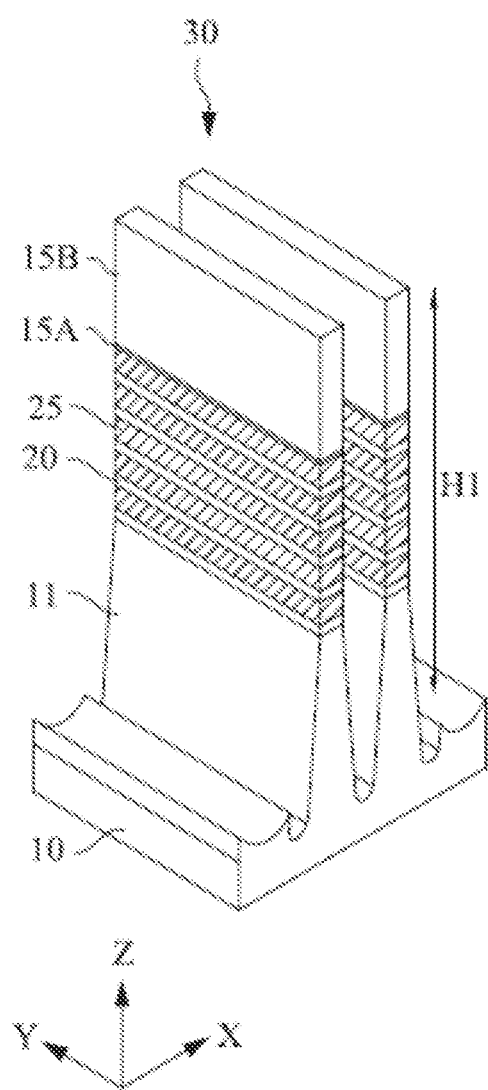
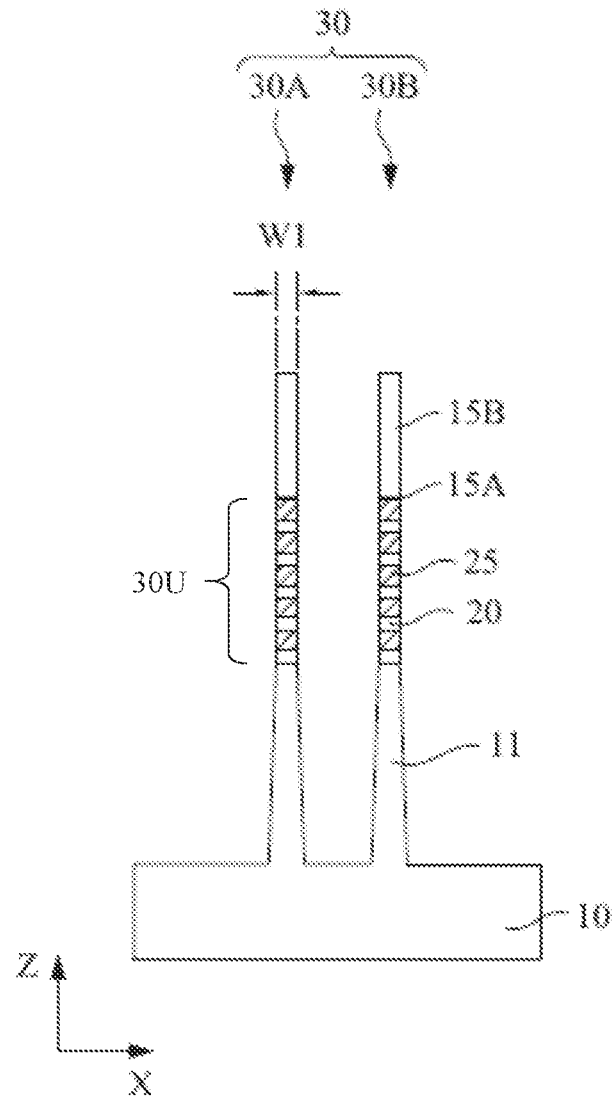
FIG. 3A                    FIG. 3B

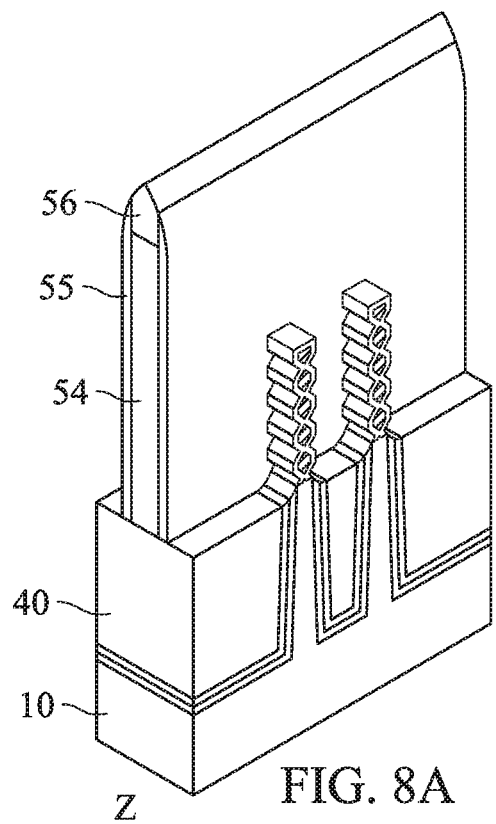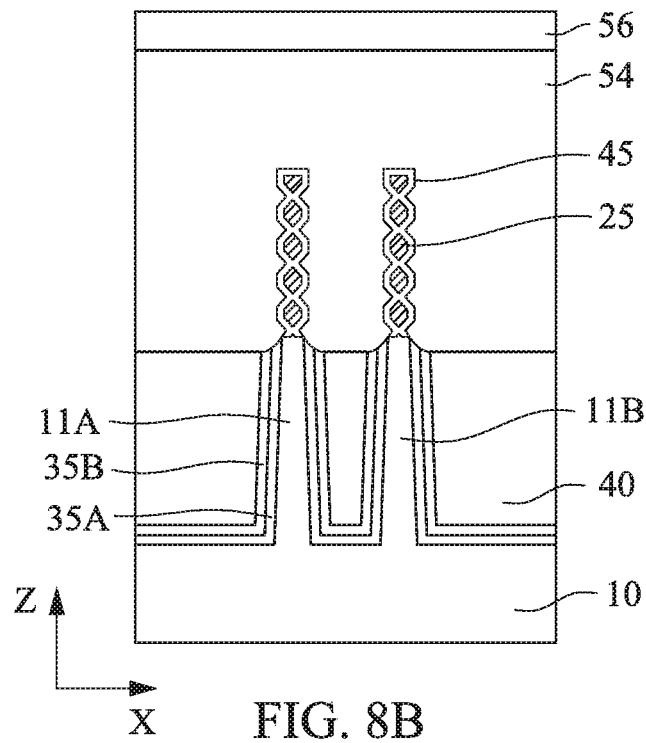
FIG. 8A
FIG. 8B
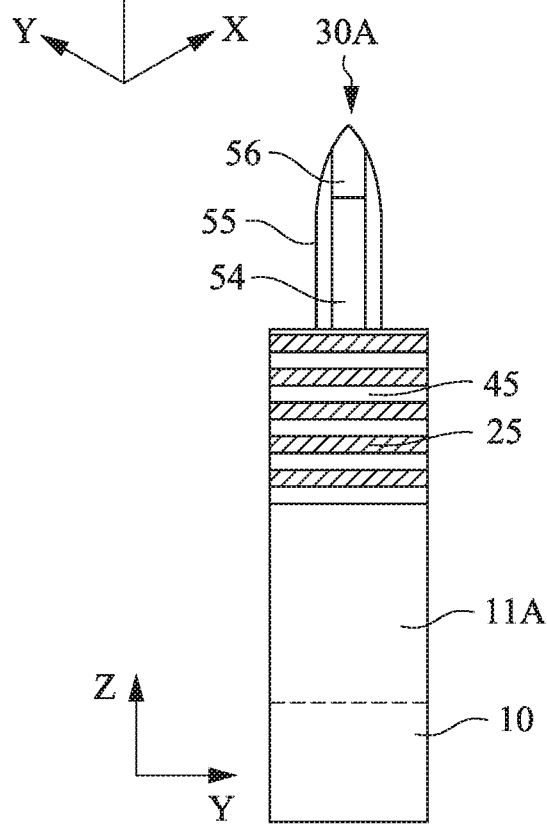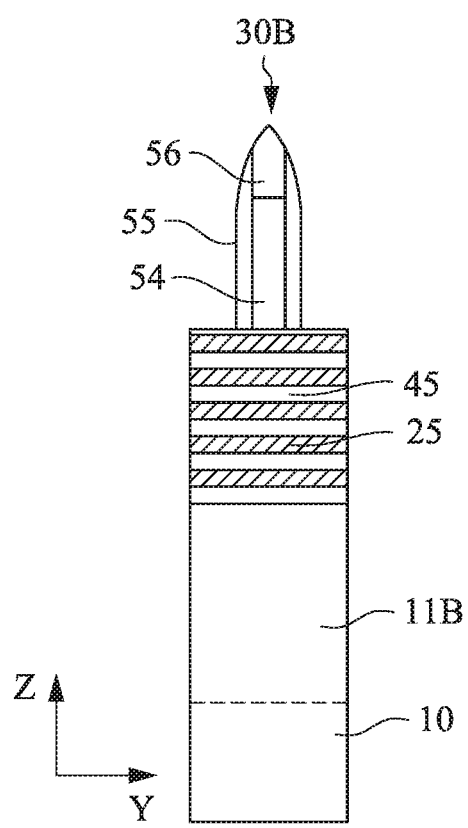
FIG. 8C
FIG. 8D

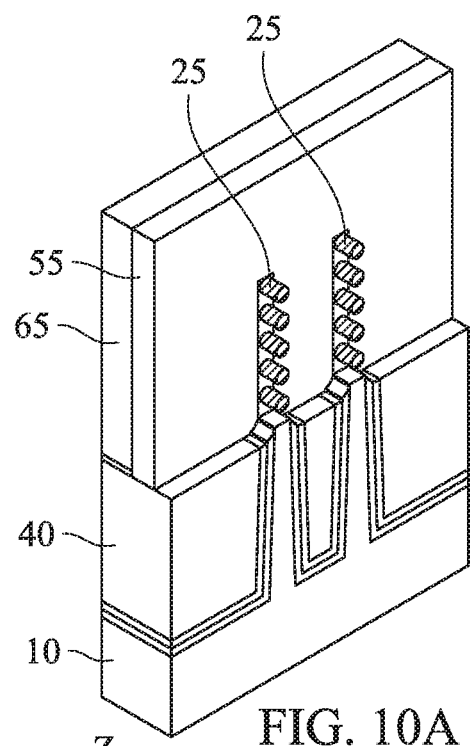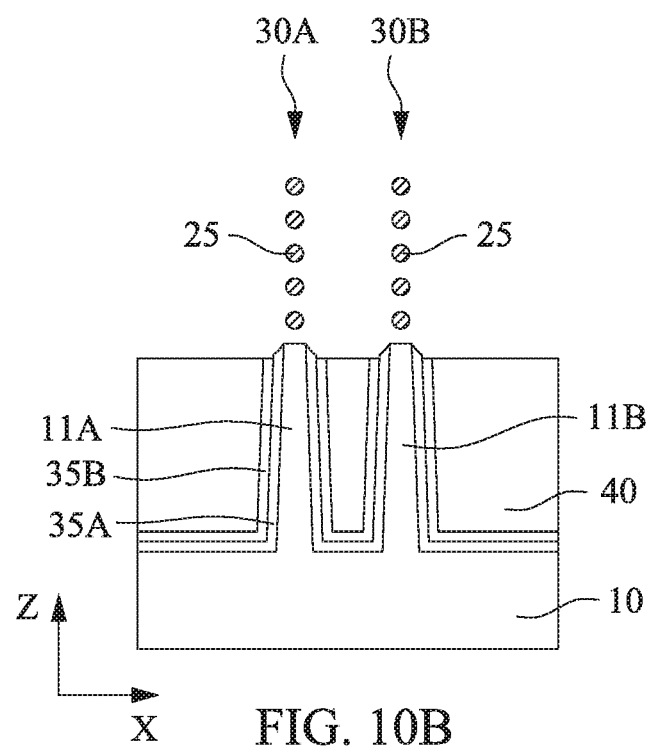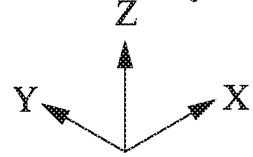
FIG. 10A
FIG. 10B
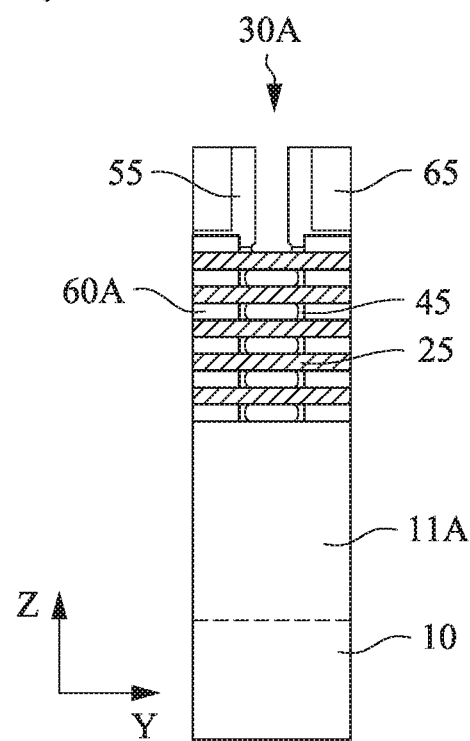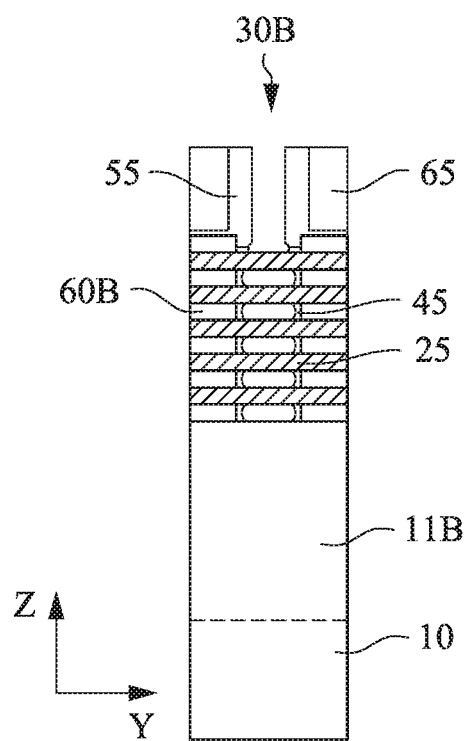
FIG. 10C
FIG. 10D

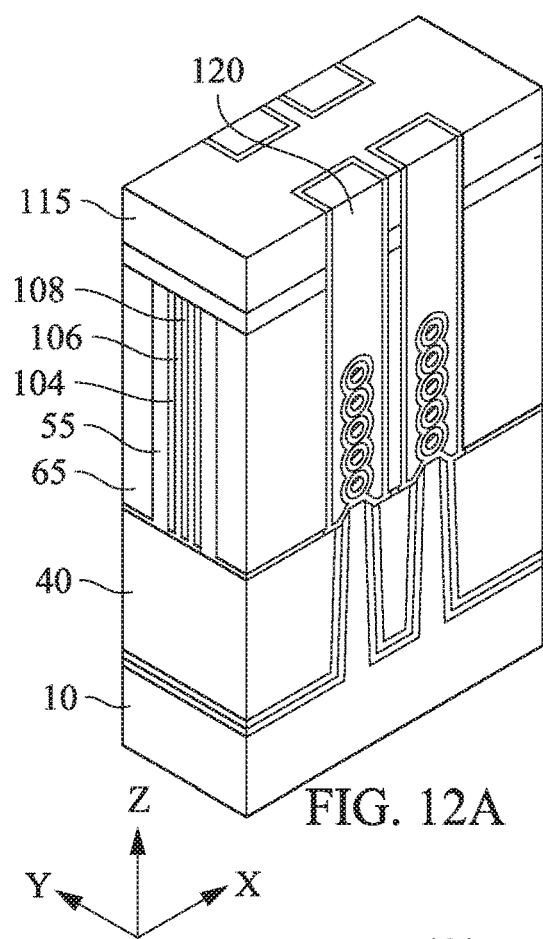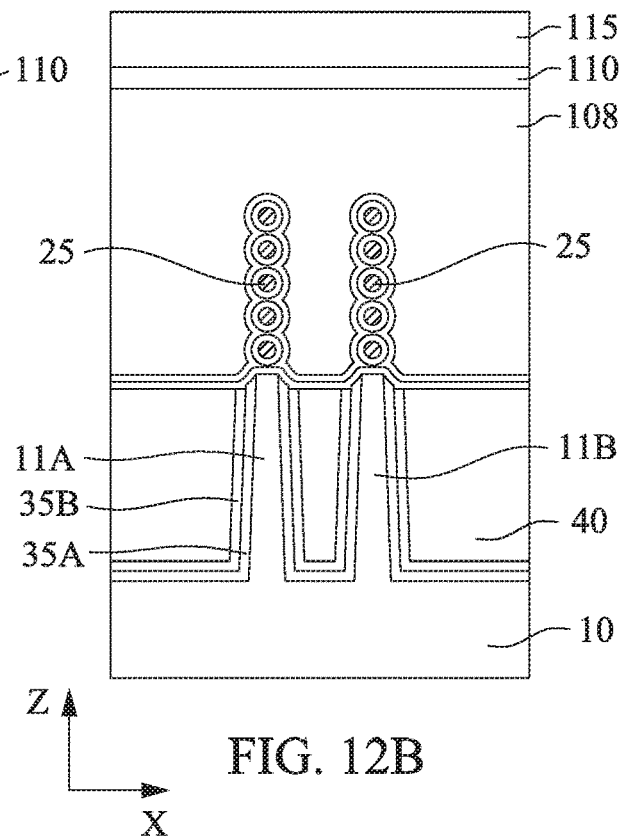
FIG. 12A
FIG. 12B
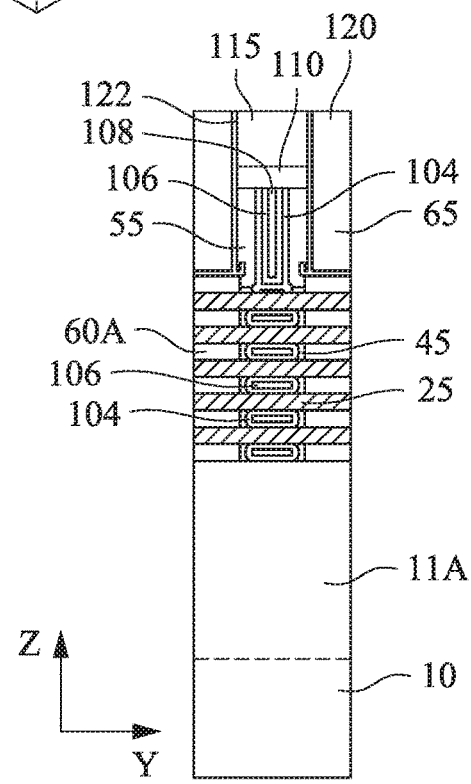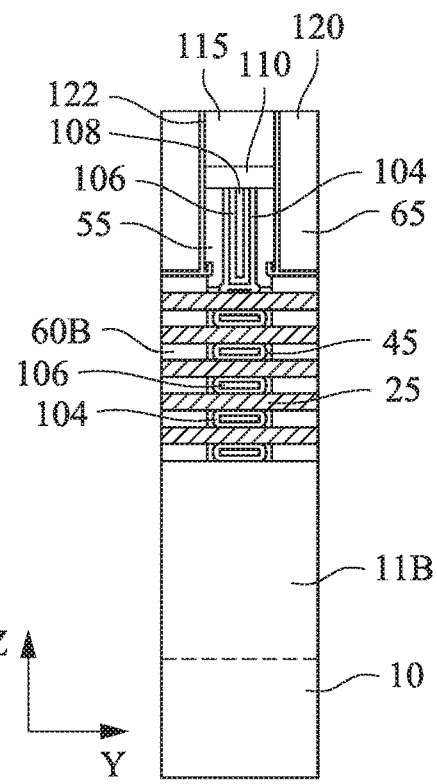
FIG. 12C
FIG. 12D

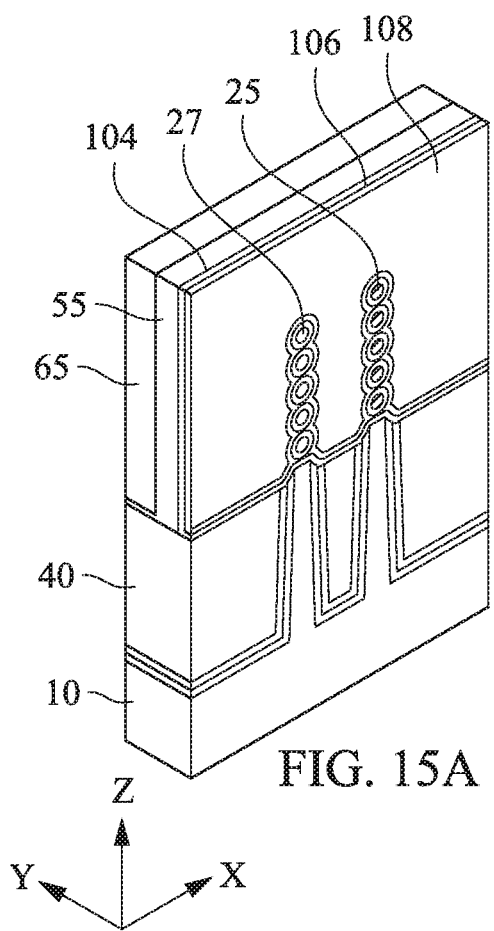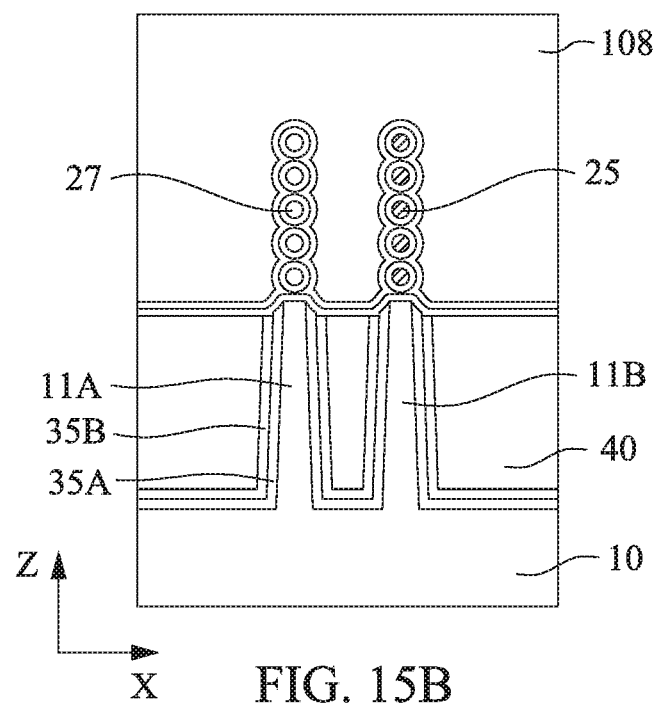
FIG. 15A  FIG. 15B
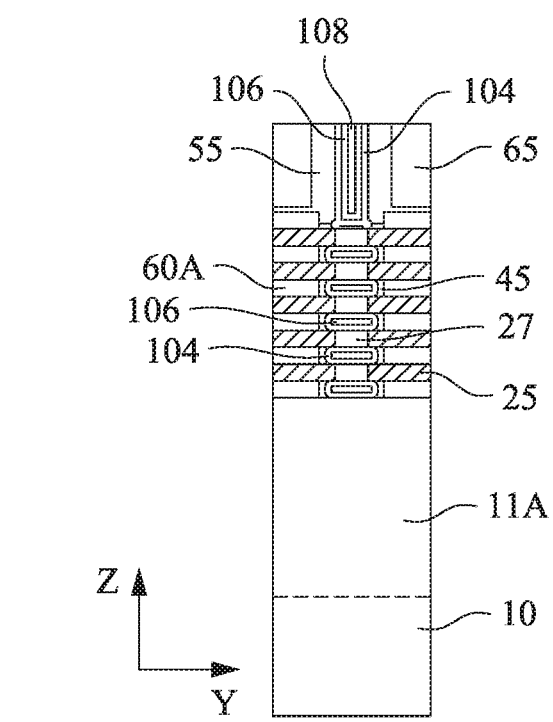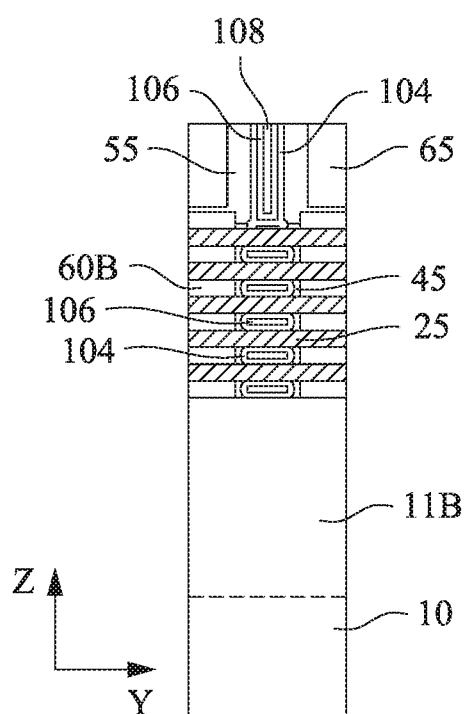
FIG. 15C  FIG. 15D

US 11,335,604 B2

METHOD OF MANUFACTURING A SEMICONDUCTOR DEVICE AND A SEMICONDUCTOR DEVICE

RELATED APPLICATIONS

This application claims priority of U.S. Provisional Patent Application No. 62/753,898 filed on Oct. 31, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show various views of one of the various stages of a sequential manufacturing process for a GAA FET device according to an embodiment of the present disclosure.

FIGS. 8A, 8B, 8C and 8D show various views of one of the various stages of a sequential manufacturing process for a GAA FET device according to an embodiment of the present disclosure.

FIGS. 10A, 10B, 10C, 10D, 10E and 10F show various views of one of the various stages of a sequential manufacturing process for a GAA FET device according to an embodiment of the present disclosure.

FIGS. 12A, 12B, 12C, 12D and 12E show various views of one of the various stages of a sequential manufacturing process for a GAA FET device according to an embodiment of the present disclosure.

FIGS. 15A, 15B, 15C, 15D, 15E and 15F show various views of one of the various stages of a sequential manufacturing process for a GAA FET device according to another embodiment of the present disclosure.

DETAILED DESCRIPTION

Figure 1:
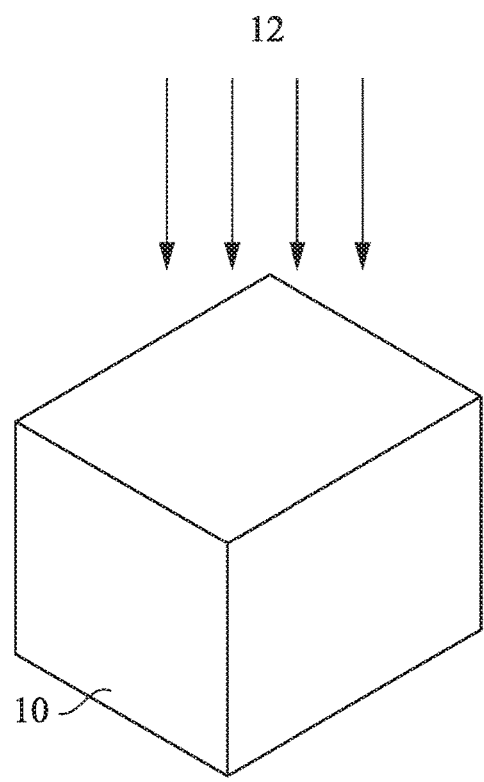
FIG. 1 shows a view of one of the various stages of a sequential manufacturing process for a GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the following embodiments, material, configurations, dimensions, operations and/or processes of one embodiment may be employed in another embodiment, unless otherwise described, and detailed explanation thereof may be omitted.

Gate-all-around (GAA) FETs with a nano-sized channel, such as a nanowire or a nanosheet, are promising devices for the further technology nodes in semiconductor integrated circuits, to realize lower operational power, higher device performance, higher device density and lower process cost, etc. How to optimize the process flow is a key challenge in terms of above criteria. In a GAA FET manufacturing flow, processes for channel epitaxy, inner spacer, nanowire formation, and metal gate with high-k dielectric formation are common process bottlenecks.

In the present disclosure, a device structure and a method of manufacturing thereof to solve the issues as set forth above are presented.

FIGS. 1-12E show a sequential process for manufacturing a GAA FET device according to an embodiment of the present disclosure. It is understood that additional operations can be provided before, during, and after the operations shown by FIGS. 1-12E, and some of the operations described below can be replaced or eliminated, for additional embodiments of the method. The order of the operations/processes may be interchangeable.

As shown in FIG. 1, impurity ions (dopants) 12 are implanted into a silicon substrate 10 to form a well region. The ion implantation is performed to prevent a punch-through effect. In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The Ge concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
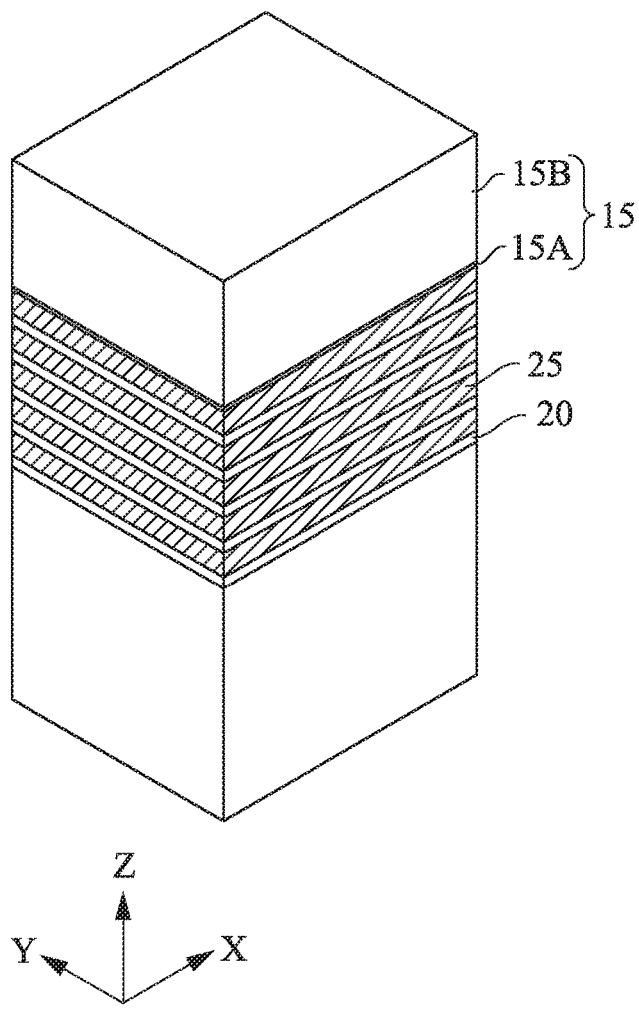
FIG. 2 shows a view of one of the various stages of a sequential manufacturing process for a GAA FET device according to an embodiment of the present disclosure.

As shown in FIG. 2, stacked semiconductor layers are formed over the substrate 10. The stacked semiconductor layers include first semiconductor layers 20 and second semiconductor layers 25. Further, a mask layer 15 is formed over the stacked layers. The first semiconductor layers 20 and the second semiconductor layers 25 are made of materials having different lattice constants, and may include one or more layers of Si, Ge, SiGe, GeSn, SiGeSn, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In certain embodiments, the first semiconductor layers 20 are $Si_{1-x}Ge_x$, where $0.15 \leq x \leq 0.5$, and the second semiconductor layers 25 are Si. In some embodiments, $0.15 \leq x \leq 0.25$. In other embodiments, the second semiconductor layers 25 are made of $Si_{1-y}Ge_y$, where y is equal to or less than about 0.2 and x>y.

In FIG. 2, five layers of the first semiconductor layer 20 and five layers of the second semiconductor layer 25 are disposed. However, the number of the layers are not limited to five, and may be as small as 1 (each layer) and in some embodiments, 2-20 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or smaller than that of the second semiconductor layers 25, and is in a range from about 2 nm to about 10 nm in some embodiments, and is in a range from about 3 nm to about 5 nm in other embodiments. The thickness of the second semiconductor layers 25 is in a range from about 5 nm to about 20 nm in some embodiments, and is in a range from about 7.5 nm to about 12.5 nm in other embodiments. The thickness of each of the first and second semiconductor layers may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Next, as shown in FIGS. 3A and 3B, the stacked layers of the first and second semiconductor layers 20, 25 are patterned by using the patterned mask layer, thereby the stacked layers are formed into fin structures 30 extending in the Y direction and arranged along the X direction.

The fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

Figures 4A, 4B:
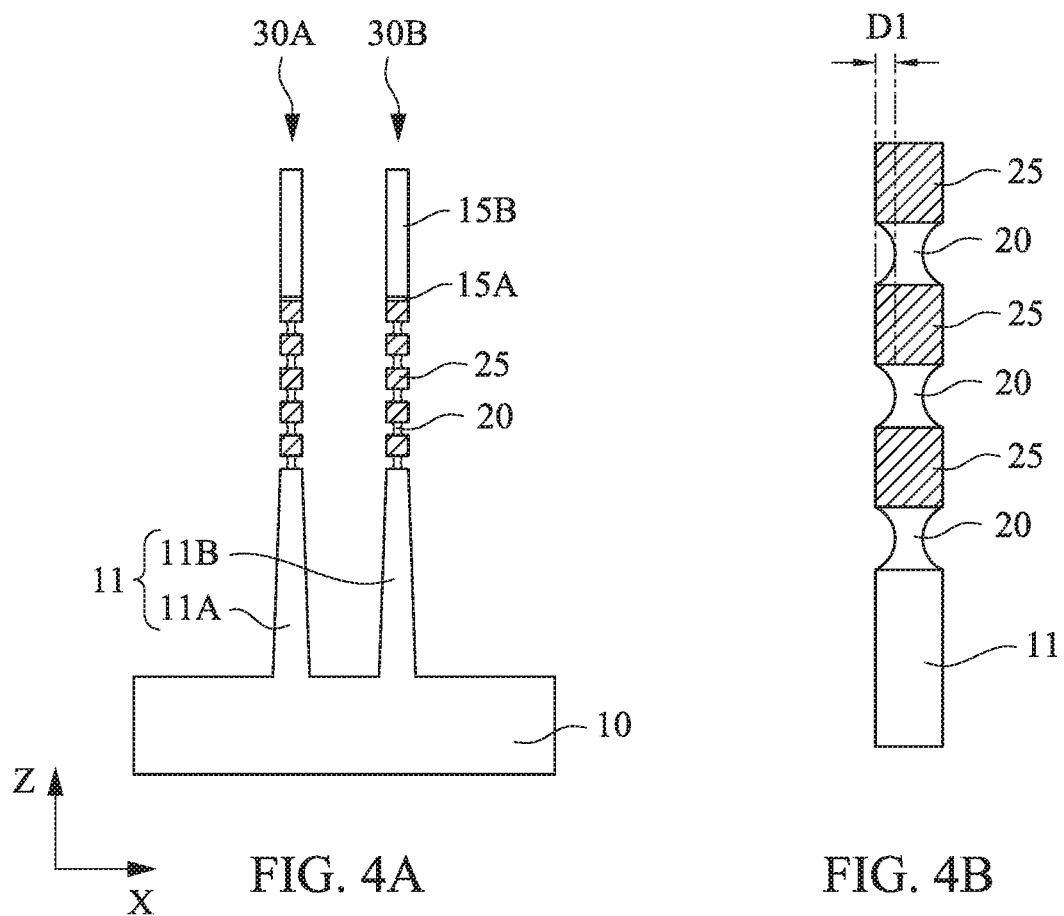
FIGS. 4A and 4B show various views of one of the various stages of a sequential manufacturing process for a GAA FET device according to an embodiment of the present disclosure.

In FIGS. 3A and 3B, two fin structures 30A and 30B are arranged in the X direction. But the number of the fin structures is not limited to two, and may be as small as one and three or more. In some embodiments, one or more dummy fin structures are formed on both sides of the fin structures 30 to improve pattern fidelity in the patterning operations. As shown in FIGS. 3A and 3B, the fin structures 30 have upper portions 30U, which corresponds to an upper fin structure, constituted by the stacked semiconductor layers 20, 25 and well portions 11, which correspond to the lower fin structure. In some embodiments, the fin structure 30A is for a p-channel GAA FET and the fin structure 30B is for an n-channel GAA FET. As shown in FIG. 4A, the fin structures 30A and 30B are disposed over lower fin structures 11A and 11B, respectively. In other embodiments, the fin structures are for the same type FET.

The width W1 of the upper portion of the fin structure 30 along the X direction is in a range from about 5 nm to about 30 nm in some embodiments, and is in a range from about 7.5 nm to about 15 nm in other embodiments. The height H1 along the Z direction of the fin structure 30 is in a range from about 50 nm to about 200 nm.

After the fin structure is formed, the first semiconductor layers 20 are laterally partially etched as shown in FIGS. 4A and 4B. In some embodiments, plasma dry etching is used to selectively etch the first semiconductor layers 20 against the second semiconductor layers 25, followed by a wet cleaning process using buffered HF. In some embodiments, a plasma source gas includes 02. In other embodiments, a wet etching process is used to selectively etch the first semiconductor layers 20. The etching solution (etchant) includes an aqueous solution of $NH_4OH$, $H_2O_2$ and $H_2O$ and/or an aqueous solution of $H_2SO_4$, $H_2O_2$ and $H_2O$. In other embodiments, the wet etchant includes a tetramethylammonium hydroxide (TMAH) solution. In some embodiments, an additional wet cleaning process using buffered HF is performed. In certain embodiments, both the plasma dry etching and the wet etching are used. In some embodiments, the etching amount D1 is in a range from about 1 nm to about 10 nm, and is in a range from about 2 nm to about 5 nm. As shown in FIG. 4B, the cross sectional shape of the etched first semiconductor layers 20 has a dog-bone shape or a thread-spool (or bobbin) shape.

After the first semiconductor layers 20 are partially etched, an insulating material layer including one or more layers of insulating material is formed over the substrate so that the fin structures 30A and 30B are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer.

Figure 5:
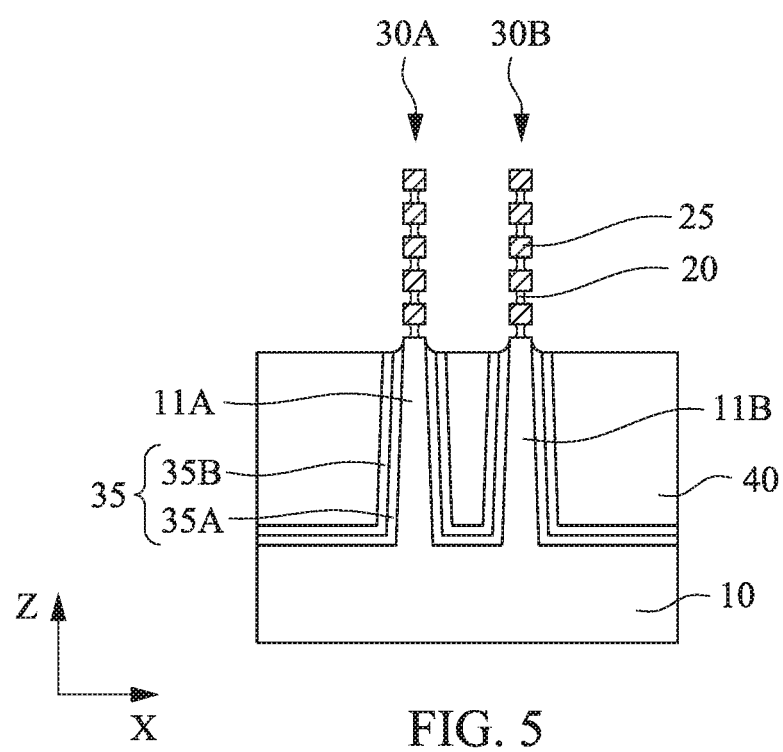
FIG. 5 shows a view of one of the various stages of a sequential manufacturing process for a GAA FET device according to an embodiment of the present disclosure

In some embodiments, one or more fin liner layers 35 are formed before forming the insulating material layer, as shown FIG. 5. The liner layer 35 is made of SiN or a silicon nitride-based material (e.g., SiON, SiCN or SiOCN). In some embodiments, the fin liner layers 35 include a first fin liner layer 35A formed over the substrate 10 and side faces of the bottom fin structures 11, and a second fin liner layer 35B formed on the first fin liner layer 35A. Each of the liner layers has a thickness between about 1 nm and about 20 nm in some embodiments. In some embodiments, the first fin liner layer 35A includes silicon oxide and has a thickness between about 0.5 nm and about 5 nm, and the second fin liner layer 35B includes silicon nitride and has a thickness between about 0.5 nm and about 5 nm. The fin liner layers 35 may be deposited through one or more processes such as physical vapor deposition (PVD), chemical vapor deposition (CVD), or atomic layer deposition (ALD), although any acceptable process may be utilized.

Then, as shown in FIG. 5, the insulating material layer is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI). In the embodiment shown in FIG. 5, the insulating material layer is recessed until the top of the lower fin structure 11 is exposed. The first semiconductor layers 20 are sacrificial layers which are subsequently partially removed, and the second semiconductor layers 25 are subsequently formed into channel layers of a GAA FET. In other embodiments, after the isolation insulating layer 40 is formed, the first semiconductor layers 20 are partially etched.

Figure 6A:
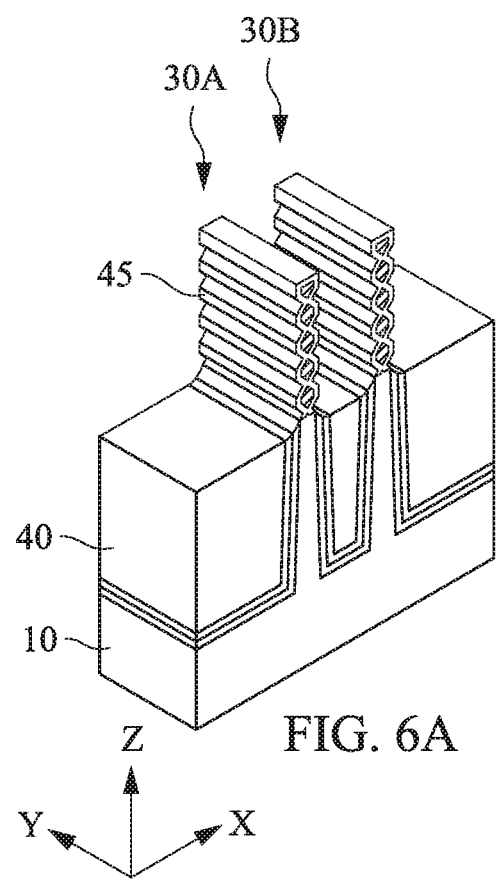
FIGS. 6A, 6B, 6C and 6D show various views of one of the various stages of a sequential manufacturing process for a GAA FET device according to an embodiment of the present disclosure.
Figure 6B:
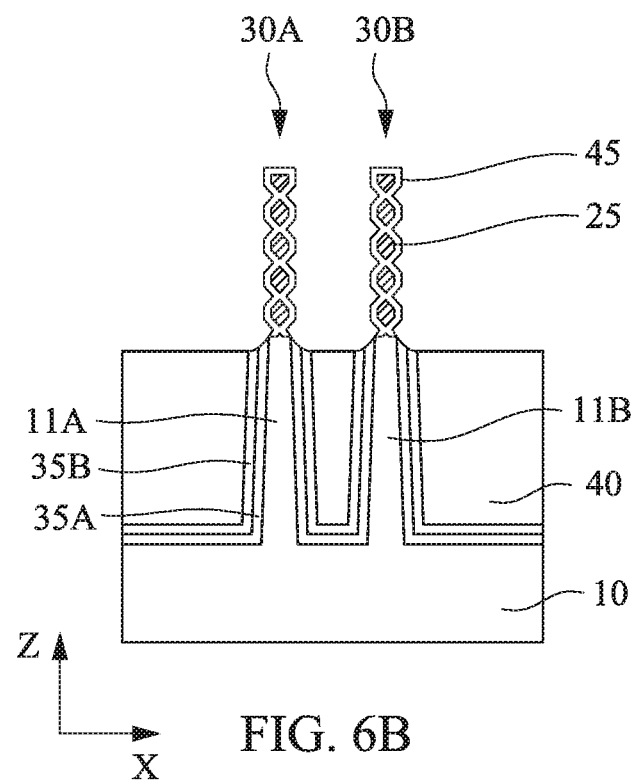
Figure 6C:
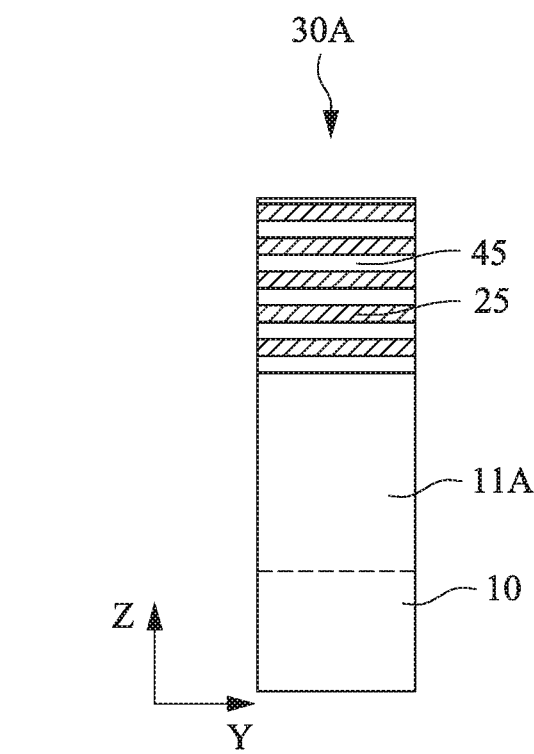
Figure 6D:
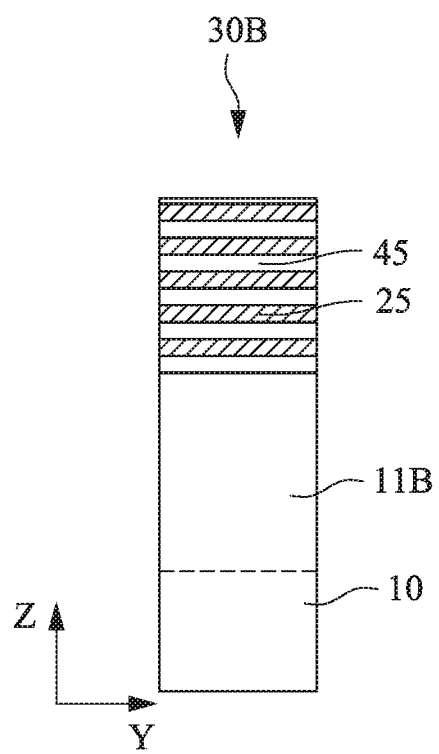

After the isolation insulating layer 40 is formed, an oxide layer 45 is formed over the upper portion of the fin structures 30A and 30B, as shown in FIGS. 6A-6D. FIG. 6A shows a perspective view, FIG. 6B shows a cross sectional view along the X direction, FIG. 6C shows a cross sectional view along the Y direction cutting fin structure 30A, and FIG. 6D shows a cross sectional view along the Y direction cutting fin structure 30B.

In some embodiments, the oxide layer 45 is formed by a thermal oxidation process to oxidize the first semiconductor layers 20 and the second semiconductor layer 25. In some embodiments, the thermal oxidization process is performed in an oxidizing ambient including 02 and/or 03. In certain embodiments, the thermal process is performed at a temperature in a range from about 800° C. to about 1000° C. In other embodiments, a wet oxidation process is used. In certain embodiments, a chemical oxidation process is performed.

In some embodiments, by the thermal oxidation, the first semiconductor layers 20 are fully oxidized into the oxide layer 45. In other embodiments, a part of the first semiconductor layers 20 remains in the fin structures. In some embodiments, the width of the remaining first semiconductor layer 20 is in a range from about 0.5 nm to about 2 nm. In some embodiments, the thickness of the oxide layer 45 is in a range from about 1 nm to about 5 nm.

When the first semiconductor layers 20 are made of SiGe, and the second semiconductor layers 25 are made of Si, the oxide layer 45 includes a silicon-germanium oxide part and a silicon oxide part at corresponding portions. In some embodiments, the silicon-germanium oxide portion is mainly disposed between adjacent second semiconductor layers 25. In some embodiments, the silicon oxide portion is mainly disposed on side faces of the second semiconductor layers 25.

In some embodiments, after the oxide layer 45 is formed, an annealing operation is performed. The annealing process is performed at a temperature in a range from about 800° C. to about 1000° C. in some embodiments.

Figure 7A:
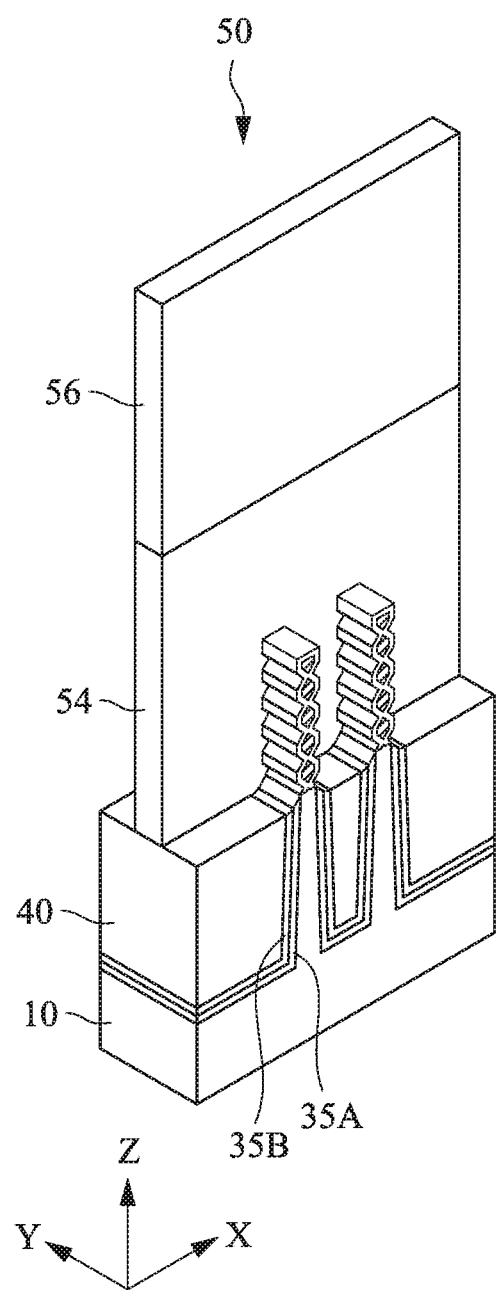
FIGS. 7A, 7B, 7C and 7D show various views of one of the various stages of a sequential manufacturing process for a GAA FET device according to an embodiment of the present disclosure.
Figure 7B:
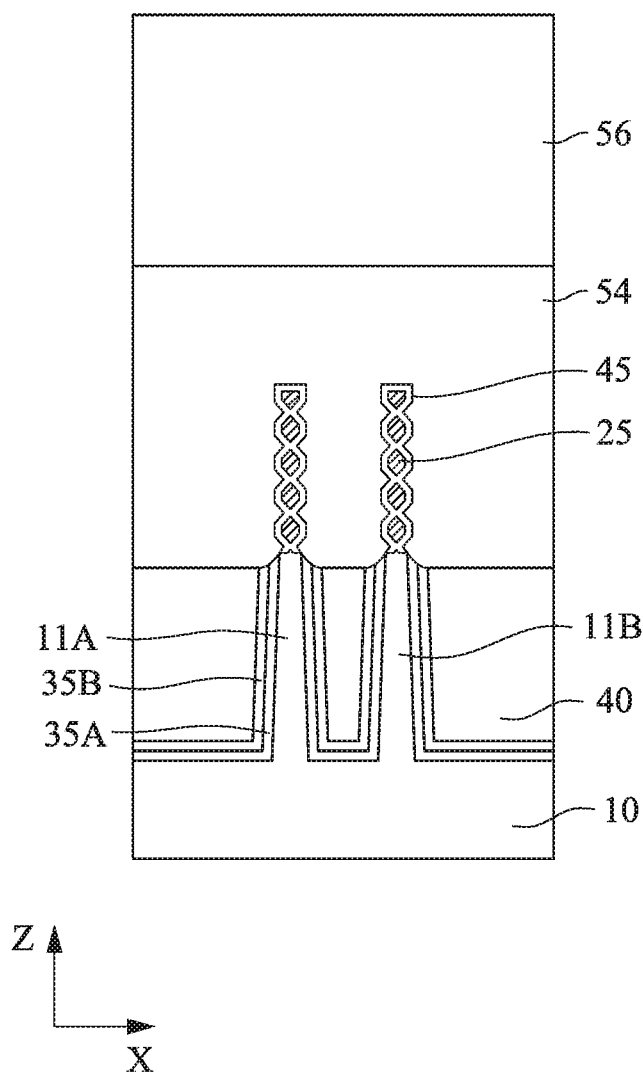
Figures 7C, 7D:
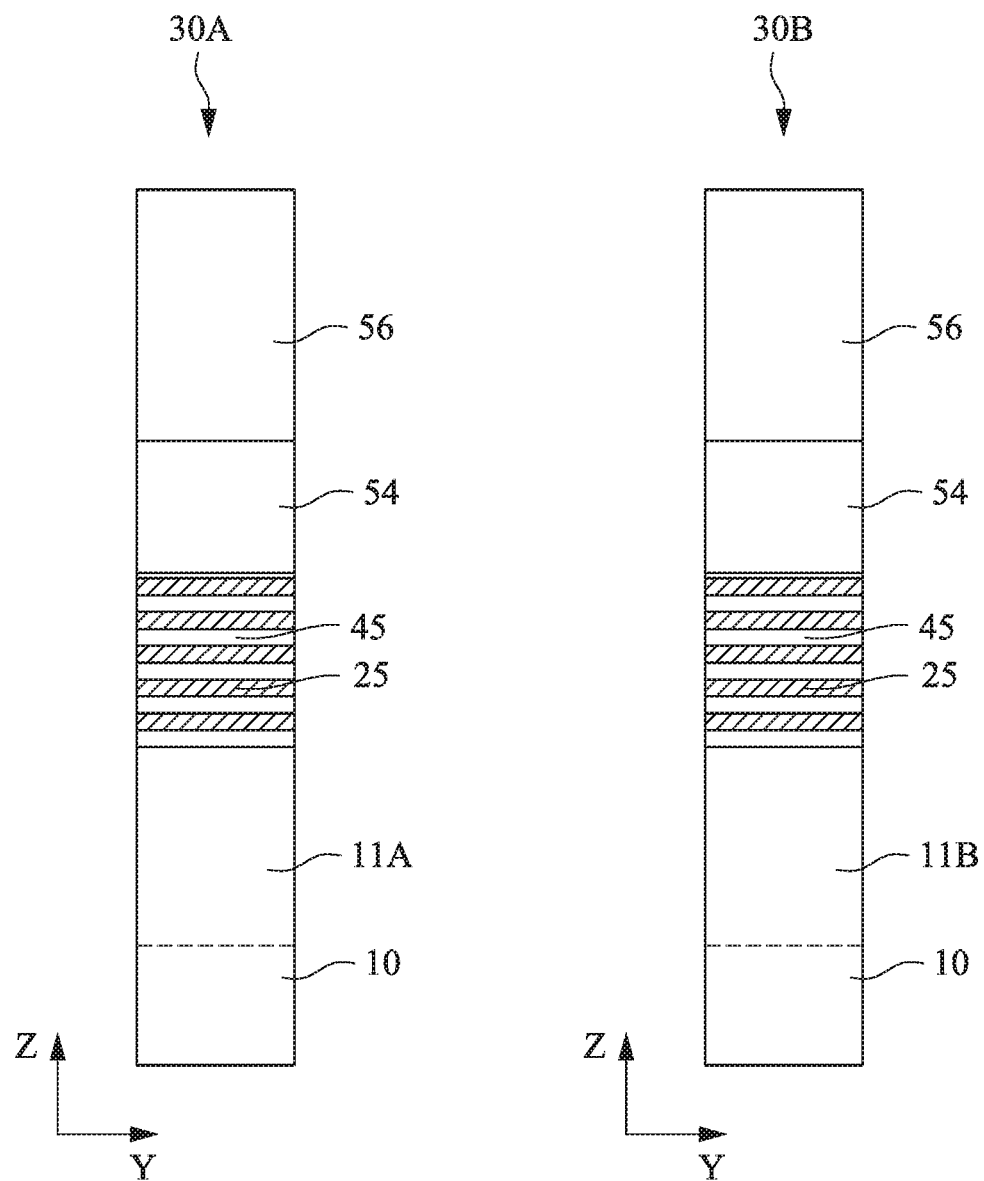

After the oxide layer 45 is formed, a sacrificial gate structure 50 is formed over the fin structures 30A and 30B with the oxide layer 45, as shown in FIGS. 7A-7D. FIG. 7A shows a perspective view, FIG. 7B shows a cross sectional view along the X direction cutting a sacrificial gate structure, FIG. 7C shows a cross sectional view along the Y direction cutting fin structure 30A, and FIG. 7D shows a cross sectional view along the Y direction cutting fin structure 30B.

The sacrificial gate structure 50 includes a sacrificial gate electrode 54. In some embodiments, no sacrificial gate dielectric layer is formed. The sacrificial gate structure 50 is formed over a portion of the fin structures which is to be a channel region. The sacrificial gate structure 50 defines the channel region of the GAA FET.

The sacrificial gate structure 50 is formed by first blanket depositing the sacrificial gate electrode layer over the fin structures 30A and 30B, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate electrode layer are deposited using CVD, including LPCVD and PECVD, PVD, ALD, or other suitable process. Subsequently, a mask layer 56 is formed over the sacrificial gate electrode layer. The mask layer 56 includes one or more of a silicon nitride (SiN) layer and a silicon oxide layer.

Next, a patterning operation is performed on the mask layer and sacrificial gate electrode layer is patterned into the sacrificial gate structure 50, as shown in FIGS. 7A-7D. The sacrificial gate structure 50 includes the sacrificial gate electrode layer 54 (e.g., poly silicon), and the mask layer 56.

By patterning the sacrificial gate structure, the upper portion of the fin structure with the second semiconductor layers 25 and the oxide layer 45 are partially exposed on opposite sides of the sacrificial gate structure 50, thereby defining source/drain (S/D) regions, as shown in FIGS. 7A-7D. In this disclosure, a source and a drain are interchangeably used and the structures thereof are substantially the same. In FIGS. 7A-7D, one sacrificial gate structure 50 is formed, but the number of the sacrificial gate structures is not limited to one. Two or more sacrificial gate structures are arranged in the Y direction in some embodiments. In certain embodiments, one or more dummy sacrificial gate structures are formed on both sides of the sacrificial gate structures to improve pattern fidelity.

After the sacrificial gate structure 50 is formed, gate sidewall spacers 55 are formed, as shown in FIGS. 8A-8D. FIG. 8A shows a perspective view, FIG. 8B shows a cross sectional view along the X direction cutting the sacrificial gate structure 50, FIG. 8C shows a cross sectional view along the Y direction cutting fin structure 30A, and FIG. 8D shows a cross sectional view along the Y direction cutting fin structure 30B.

To form the gate sidewall spacer 55, a blanket layer of an insulating material is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 20 nm. In some embodiments, the insulating material of the blanket layer is a silicon nitride-based material, such as SiN, SiON, SiOCN or SiCN and combinations thereof. In certain embodiments, the insulating material is one of SiOC, SiCON and SiCN.

Further, as shown in FIGS. 8A-8D, the gate sidewall spacers 55 are formed on opposite sidewalls of the sacrificial gate structures by anisotropic etching. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 56 may be exposed from the sidewall spacers. In some embodiments, an isotropic etching process may be subsequently performed to remove the insulating material from the upper portions of the S/D region of the exposed fin structures 30.

Subsequently, the oxide layer 45 formed around the second semiconductor layer 25 in the source drain region is removed by suitable dry and/or wet etching operations.

Figure 9A:
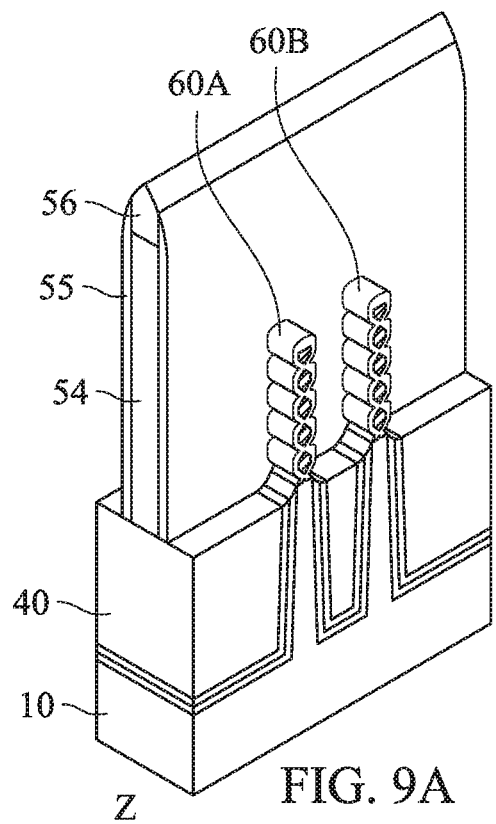
FIGS. 9A, 9B, 9C, 9D and 9E show various views of one of the various stages of a sequential manufacturing process for a GAA FET device according to an embodiment of the present disclosure.
Figure 9B:
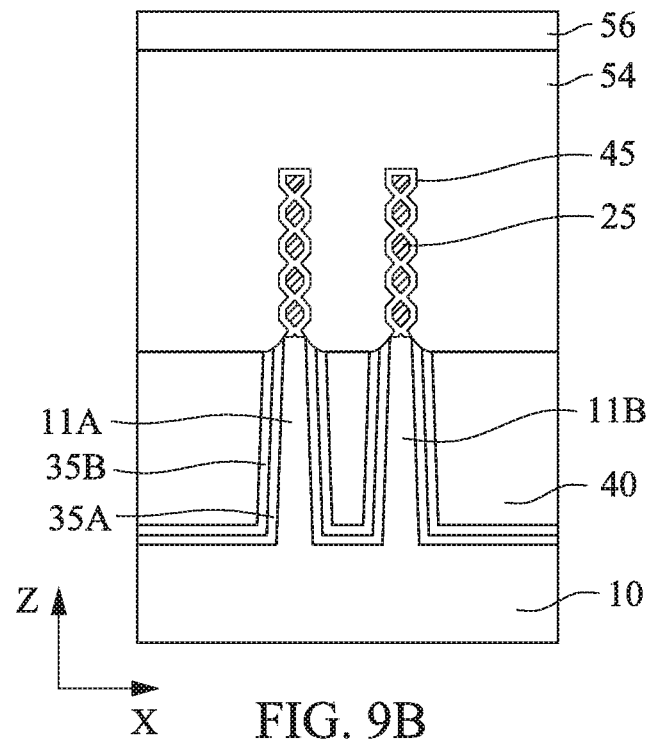
Figure 9C:
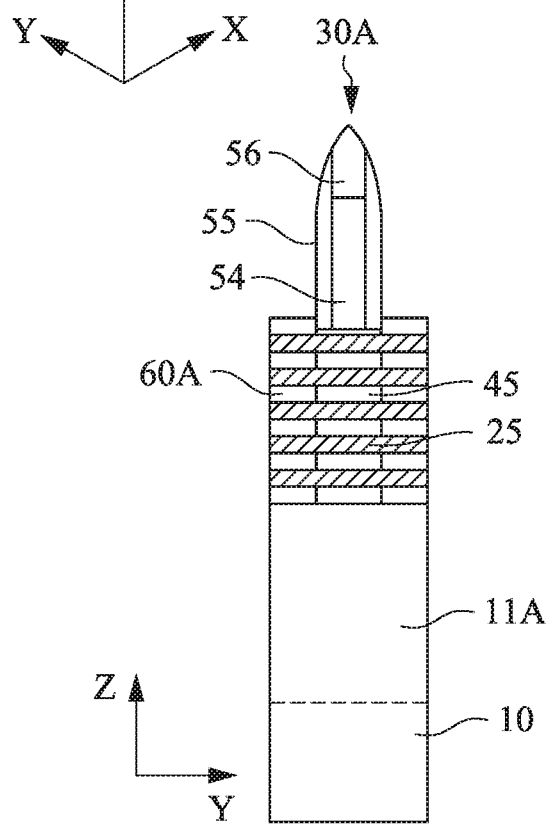
Figure 9D:
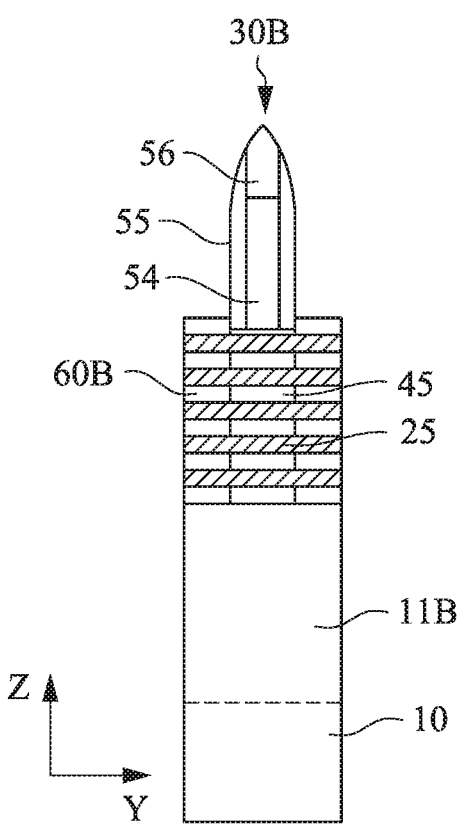
Figure 9E:
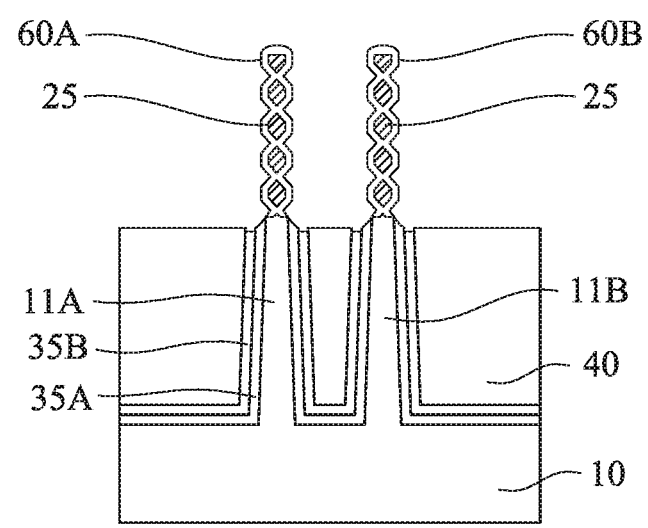

Next, as shown in FIGS. 9A-9E, source/drain epitaxial layers 60A and 60B are formed. FIG. 9A shows a perspective view, FIG. 9B shows a cross sectional view along the X direction cutting the sacrificial gate structure 50, FIG. 9C shows a cross sectional view along the Y direction cutting fin structure 30A, FIG. 9D shows a cross sectional view along the Y direction cutting fin structure 30B, and FIG. 9E shows a cross sectional view along the X direction cutting the source/drain region.

The first S/D epitaxial layer 60A is formed wrapping around the second semiconductor layers 25 in the S/D region of the fin structure 30A. The first S/D epitaxial layer 60A includes one or more layers of Si, SiGe and SiGeP for a p-channel FET. The first S/D epitaxial layer 60A is formed by an epitaxial growth method using CVD, ALD or molecular beam epitaxy (MBE). In some embodiments, boron (B) is contained in the first S/D epitaxial layer 60A. The second S/D epitaxial layer 60B is formed wrapping around the second semiconductor layers 25 in the S/D region of the fin structure 35B. The second S/D epitaxial layer 60B includes one or more layers of Si, SiP, SiC and SiCP for an n-channel FET. The second S/D epitaxial layer 60B is formed by an epitaxial growth method using CVD, ALD or molecular beam epitaxy (MBE). In some embodiments, the first source/drain (S/D) epitaxial layer 60A for a p-channel FET and the second S/D epitaxial layer 60B for an n-channel FET are separately formed.

Figure 10E:
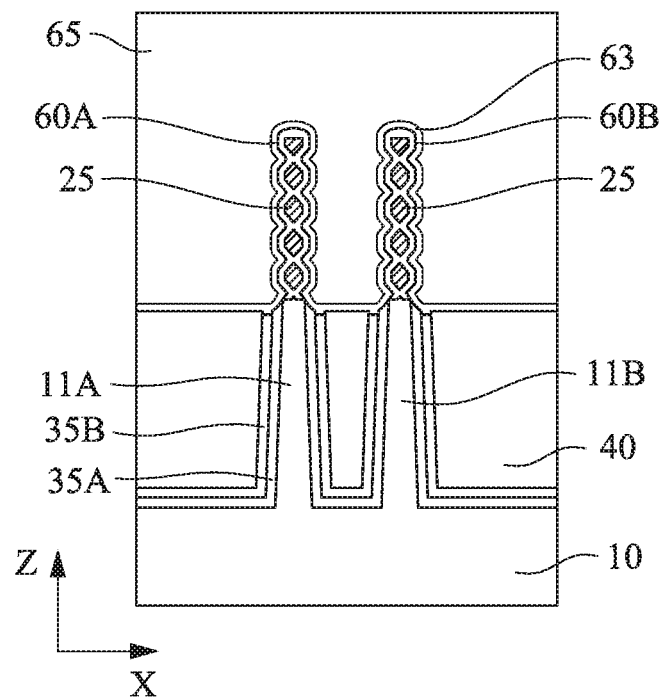
Figure 10F:
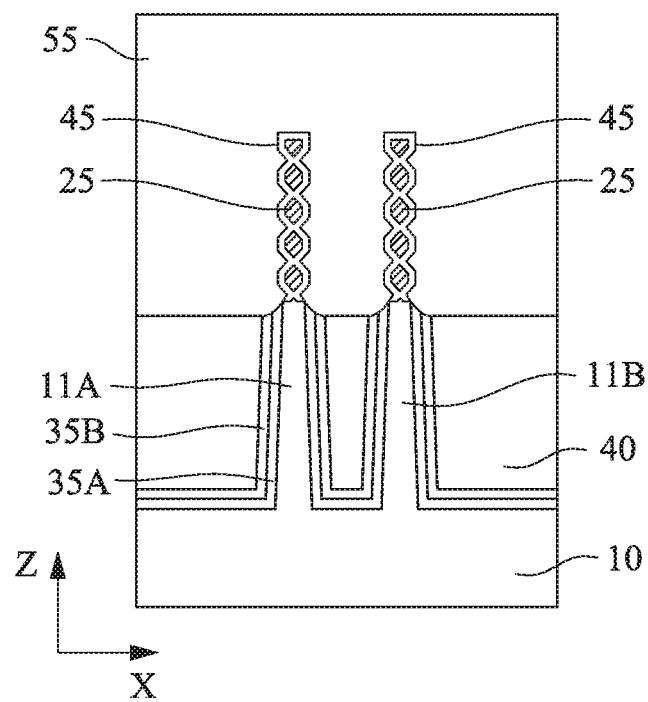

Subsequently, a first insulating liner layer 63 is formed and then an interlayer dielectric (ILD) layer 65 is formed, and then the sacrificial gate structure 50 is removed, as shown in FIGS. 10A-10F. FIG. 10A shows a perspective view, FIG. 10B shows a cross sectional view along the X direction cutting the channel region, FIG. 10C shows a cross sectional view along the Y direction cutting fin structure 30A, FIG. 10D shows a cross sectional view along the Y direction cutting fin structure 30B, FIG. 10E shows a cross sectional view along the X direction cutting the source/drain region, and FIG. 10F shows a cross sectional view along the X direction cutting the gate sidewall spacer 55.

The first insulating liner layer 63 is made of a silicon nitride-based material, such as silicon nitride, and functions as a first contact etch stop layer (CESL) in the subsequent etching operations. The materials for the first ILD layer 65 include compounds comprising Si, O, C and/or H, such as silicon oxide, SiCOH and SiOC. Organic materials, such as polymers, may be used for the first ILD layer 65. After the first ILD layer 65 is formed, a planarization operation, such as CMP, is performed, so that the sacrificial gate electrode layer 54 is exposed.

Next, as shown in FIGS. 10A-10F, the sacrificial gate electrode layer 54 are removed, and further the oxide layer 45 is removed, thereby exposing channel regions of the second semiconductor layers 25 (semiconductor nano wires). The first ILD layer 65 protects the first and second S/D epitaxial layers 60A and 60B during the removal of the sacrificial gate structure. The sacrificial gate structure can be removed using plasma dry etching and/or wet etching. When the sacrificial gate electrode layer 54 is polysilicon and the first ILD layer 65 is silicon oxide, a wet etchant such as a TMAH solution can be used to selectively remove the sacrificial gate electrode layer 54. The oxide layer 45 is thereafter removed using plasma dry etching and/or wet etching.

In some embodiments, part of the oxide layer 45 remains under the gate sidewall spacers 55, as inner spacers, as shown in FIGS. 10C, 10D and 10F. The thickness of the remaining oxide layer 45 is in a range from about 0.2 nm to about 2 nm in some embodiments.

Figure 11A:
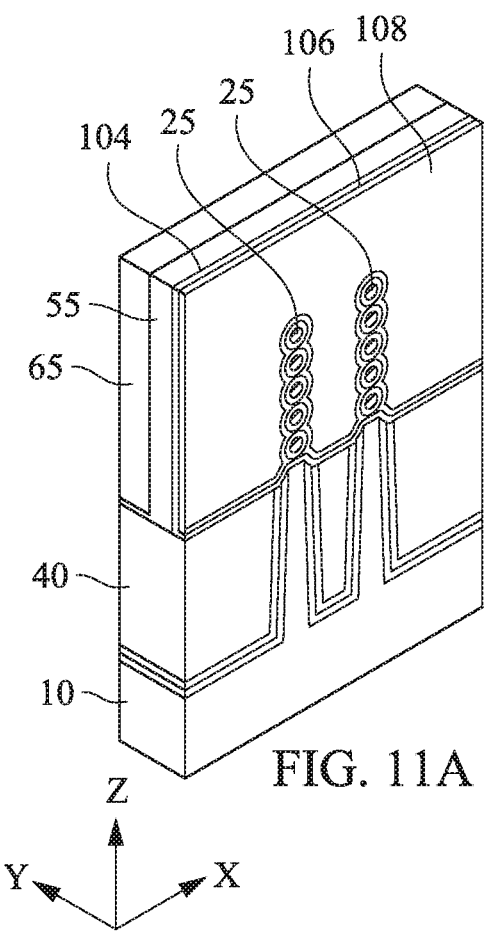
FIGS. 11A, 11B, 11C, 11D, 11E, 11F and 11G show various views of one of the various stages of a sequential manufacturing process for a GAA FET device according to an embodiment of the present disclosure.
Figure 11B:
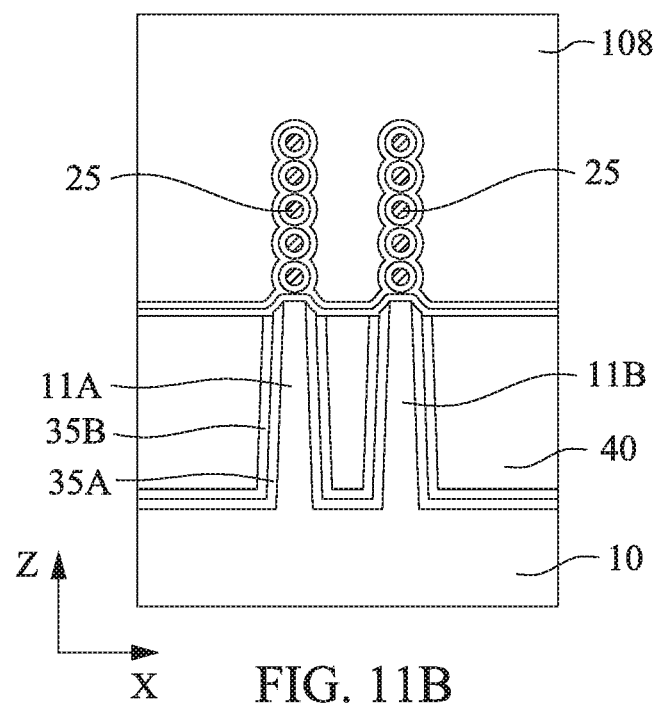
Figure 11C:
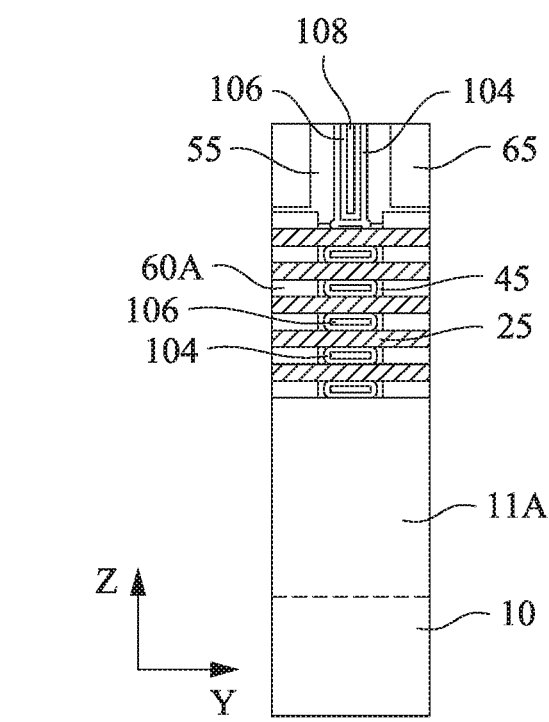
Figure 11D:
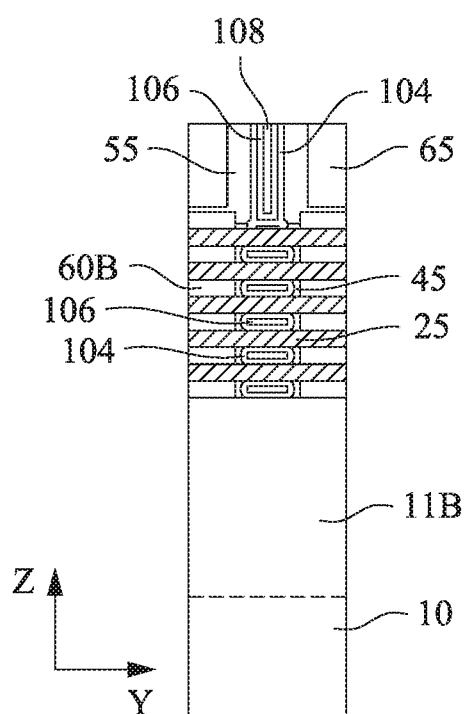
Figure 11E:
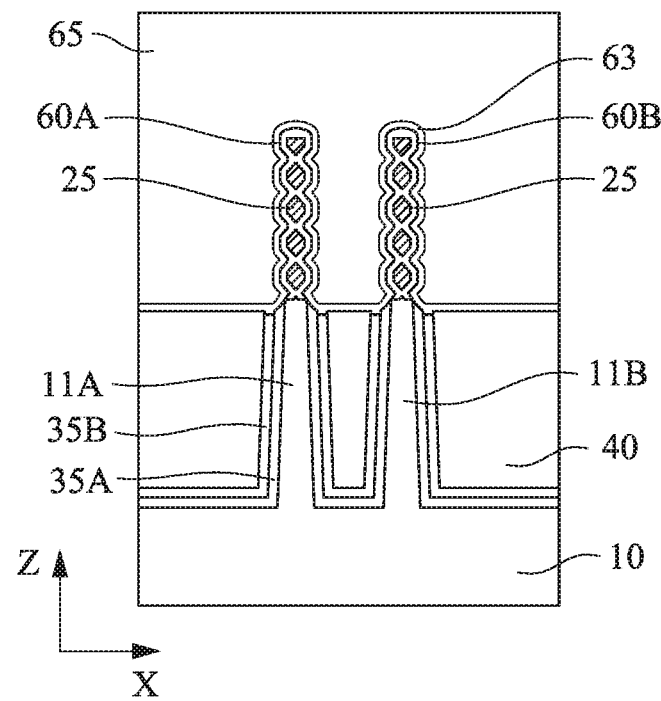
Figure 11G:
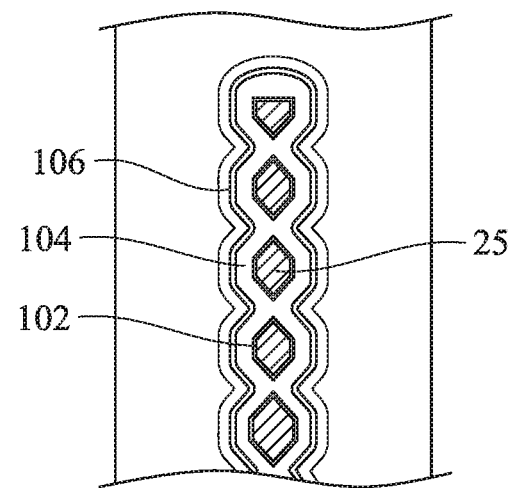
Figure 11F:
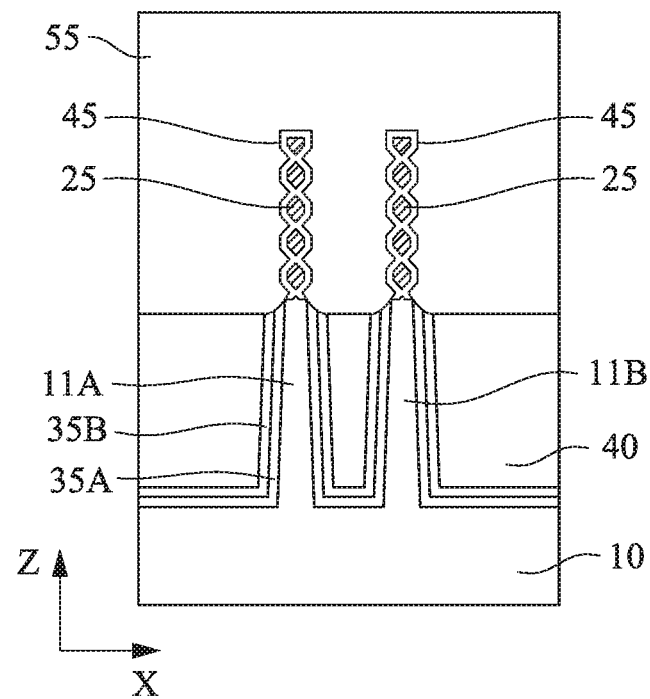

After the wires of the second semiconductor layers 25 are exposed, a gate dielectric layer 104 is formed around the wires of the second semiconductor layer 25 in the structures 30A and the fin structure 30B, as shown in FIGS. 11A-11G. FIG. 11A shows a perspective view, FIG. 11B shows a cross sectional view along the X direction cutting the channel region, FIG. 11C shows a cross sectional view along the Y direction cutting fin structure 30A, FIG. 11D shows a cross sectional view along the Y direction cutting fin structure 30B, FIG. 11E shows a cross sectional view along the X direction cutting the source/drain region, FIG. 11F shows a cross sectional view along the X direction cutting the gate sidewall spacer 55, and FIG. 11G shows an enlarged view of the channel region.

In some embodiments, the gate dielectric layer 104 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, an interfacial layer 102 is formed between the channel layers and the gate dielectric layer 104. The gate dielectric layer 104 may be formed by CVD, ALD or any suitable method. In one embodiment, the gate dielectric layer 104 is formed using a highly conformal deposition process such as ALD in order to ensure the formation of a gate dielectric layer having a uniform thickness around each channel layer. The thickness of the gate dielectric layer 104 is in a range from about 1 nm to about 6 nm in one embodiment.

Further, a gate electrode layer 108 is formed over the gate dielectric layer 104 as shown in FIGS. 11A-11G. The gate electrode layer 108 is formed over the gate dielectric layer 104 to surround each channel layer in some embodiments. The gate electrode 108 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 108 may be formed by CVD, ALD, electro-plating, or other suitable method. The gate electrode layer is also deposited over the upper surface of the first ILD layer 65. The gate dielectric layer and the gate electrode layer formed over the first ILD layer 65 are then planarized by using, for example, CMP, until the first ILD layer 65 is revealed.

In certain embodiments, one or more work function adjustment layers 106 are interposed between the gate dielectric layer 104 and the gate electrode layer 108. The work function adjustment layers 106 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer. The work function adjustment layer 106 may be formed by ALD, PVD, CVD, e-beam evaporation, or other suitable process. Further, the work function adjustment layer 106 may be formed separately for the n-channel FET and the p-channel FET which may use different metal layers.

Figure 12E:
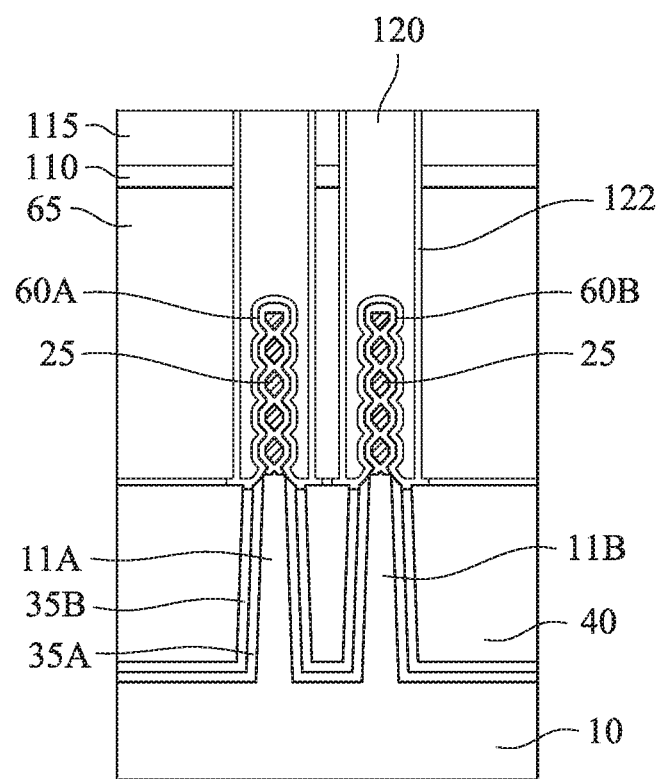

Subsequently, a second insulating liner layer 110 is formed over the first ILD layer 65 and the second ILD layer 115 is formed over the second insulating layer 110, as shown in FIGS. 12A-12E. FIG. 12A shows a perspective view, FIG. 12B shows a cross sectional view along the X direction cutting the channel region, FIG. 12C shows a cross sectional view along the Y direction cutting fin structure 30A, FIG. 12D shows a cross sectional view along the Y direction cutting fin structure 30B, and FIG. 12E shows a cross sectional view along the X direction cutting the source/drain region.

The second insulating liner layer 110 is made of a silicon nitride-based material, such as silicon nitride, and functions as a second CESL in the subsequent etching operations. The materials for the second ILD layer 115 include compounds comprising Si, O, C and/or H, such as silicon oxide, SiCOH and SiOC. Organic materials, such as polymers, may be used for the second ILD layer 110. After the second ILD layer 110 is formed, a planarization operation, such as CMP, is performed.

Then, contact openings are formed to expose the source/drain epitaxial layers 60A and 60B, respectively. The contact openings are filled with one or more layers of conductive materials, thereby forming S/D contacts, as shown in FIGS. 12A-12E. One or more layers of conductive materials are formed in and over the contact openings and then a planarization operation, such as a CMP operation, is performed to form the S/D contacts. In some embodiments, the S/D contact includes a liner layer 122 and a body layer 120. The liner layer 122 is a barrier layer and/or a glue (adhesion) layer. In some embodiments, a Ti layer is formed on the source/drain epitaxial layers 60A and 60B, and a TiN or TaN layer is formed on the Ti layer, as the liner layer 122. The body layer 120 includes one or more layers of Co, Ni, W, Ti, Ta, Cu and Al, or any other suitable material. As shown in FIGS. 12A and 12E, the S/D conductive contact wraps around the source/drain epitaxial layers 60A and 60B, respectively.

In some embodiments, when the first semiconductor layer is made of SiGe and the second semiconductor layer is made of Si, under the gate sidewall spacers 55, the oxide layer 45 include a silicon-germanium oxide portion and a silicon oxide portion. In some embodiments, under the gate sidewall spacers 55, the silicon-germanium oxide portion is mainly disposed between adjacent second semiconductor layers 25, and the silicon oxide portion is mainly disposed on side faces of the second semiconductor layers 25.

In some embodiments, under the gate sidewall spacers, the second semiconductor layer 25 have a cross section having two vertical sides, a V-shape bottom side and a reverse V-shape top side. In other embodiments, under the gate sidewall spacers, the second semiconductor layers 25 have a cross section having two vertical sides, a upwardly protruding top side and a downwardly protruding bottom side. In some embodiments, under the gate sidewall spacers, the uppermost one of the second semiconductor layers 25 has a cross section having two vertical sides, a flat top side and a downwardly protruding bottom side.

It is understood that the GAA FETs undergo further CMOS processes to form various features such as contacts/vias, interconnect metal layers, dielectric layers, passivation layers, etc.

FIGS. 13A-16E show a sequential process for manufacturing a GAA FET device according to another embodiment of the present disclosure. It is understood that additional operations can be provided before, during, and after processes shown by FIGS. 13A-16E, and some of the operations described below can be replaced or eliminated, for additional embodiments of the method. The order of the operations/processes may be interchangeable.

Figure 13A:
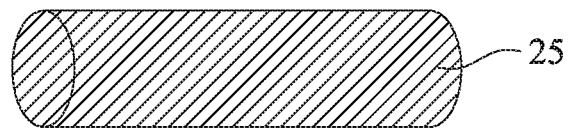
FIG. 13A shows a view of one of the various stages of a sequential manufacturing process for a GAA FET device according to another embodiment of the present disclosure.
Figure 13B:
FIG. 13B shows a view of one of the various stages of a sequential manufacturing process for a GAA FET device according to another embodiment of the present disclosure.

After the structure shown in FIGS. 9A-9E is formed, n-channel region including the fin structure 30A is covered by a mask layer, such as a silicon nitride layer, to protect the n-channel region. Then, similar to the operations explained with respect to FIGS. 10A-10E, the second semiconductor layers 25 are exposed in the channel region. FIG. 13A shows an enlarged view of one of the second semiconductor layers 25 in the channel region for a p-channel FET. Then, a third semiconductor layer 26 is formed over the second semiconductor layer 25, as shown in FIG. 13B. In some embodiments, the third semiconductor layer is made of $Si_{1-z}Ge_z$, where $0.2 \leq z \leq 1.0$. In other embodiments, $0.3 \leq z \leq 0.5$. The thickness of the third semiconductor layer 26 is in a range from about 0.2 nm to about 2 nm in some embodiments.

Figure 13C:
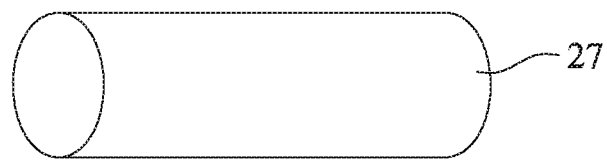
FIG. 13C shows a view of one of the various stages of a sequential manufacturing process for a GAA FET device according to another embodiment of the present disclosure.

After the third semiconductor layer 26 is formed, a thermal process is performed to form an alloy 27 of the second semiconductor layer 25 (e.g., Si) and the third semiconductor layer 26 (e.g., SiGe) as shown in FIG. 13C. The alloy 27 is $Si_{1-w}Ge_w$, where $0.3 \leq w \leq 0.7$ in some embodiments, and $0.4 \leq z \leq 0.6$ in other embodiments. The thermal treatment is performed at 900° C. to 1100° C. in some embodiments. In some embodiments, a rapid thermal annealing (RTA) is used. In certain embodiments, a laser annealing is used.

In some embodiments, an oxide cap layer is formed over the third semiconductor layer 26 before the thermal process, and after the thermal process, the oxide cap layer is removed.

Figure 14A:
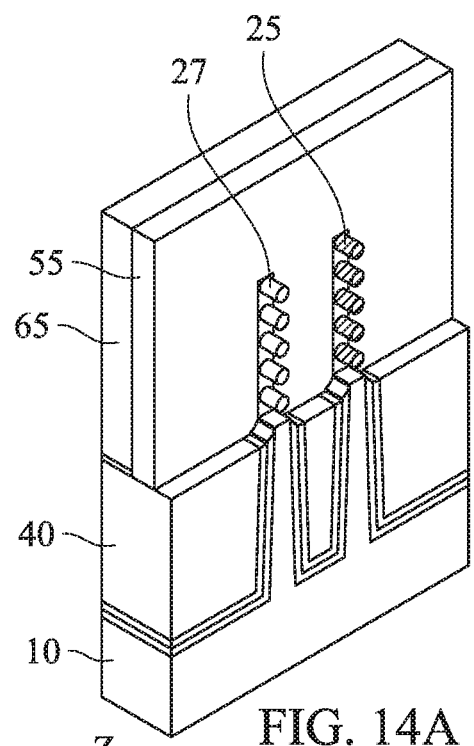
FIGS. 14A, 14B, 14C, 14D, 14E and 14F show various views of one of the various stages of a sequential manufacturing process for a GAA FET device according to another embodiment of the present disclosure.
Figure 14B:
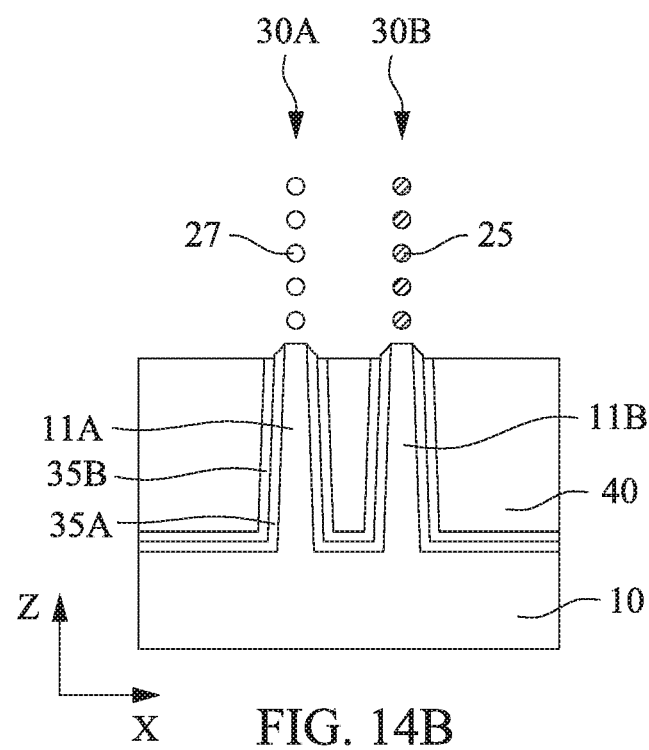
Figure 14C:
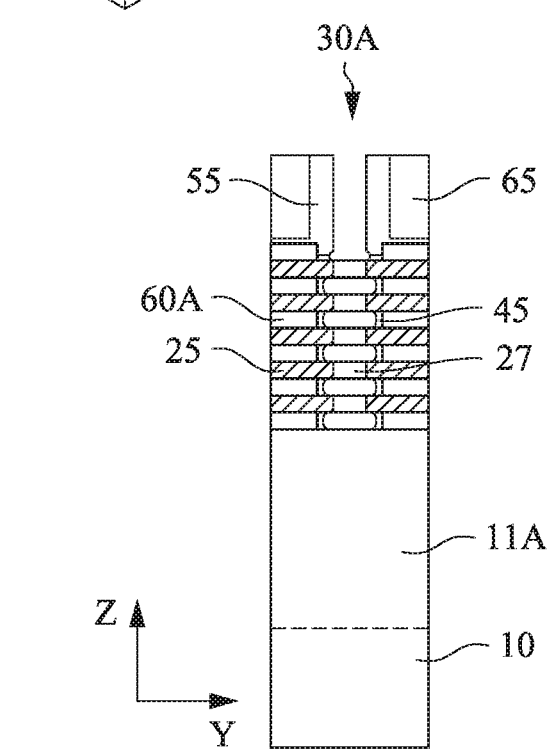
Figure 14D:
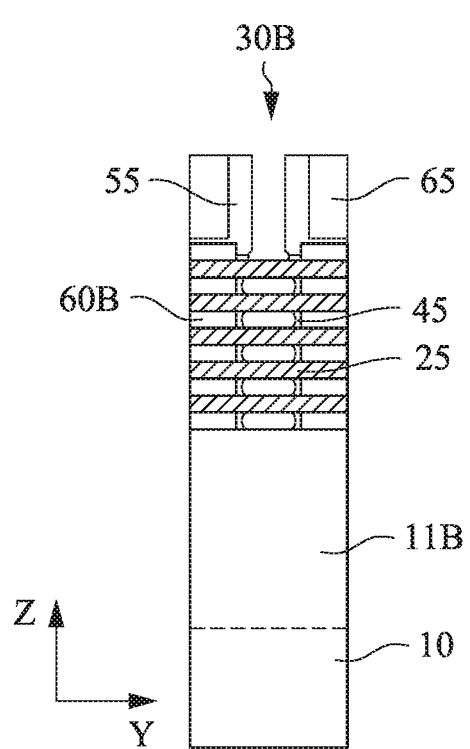
Figure 14E:
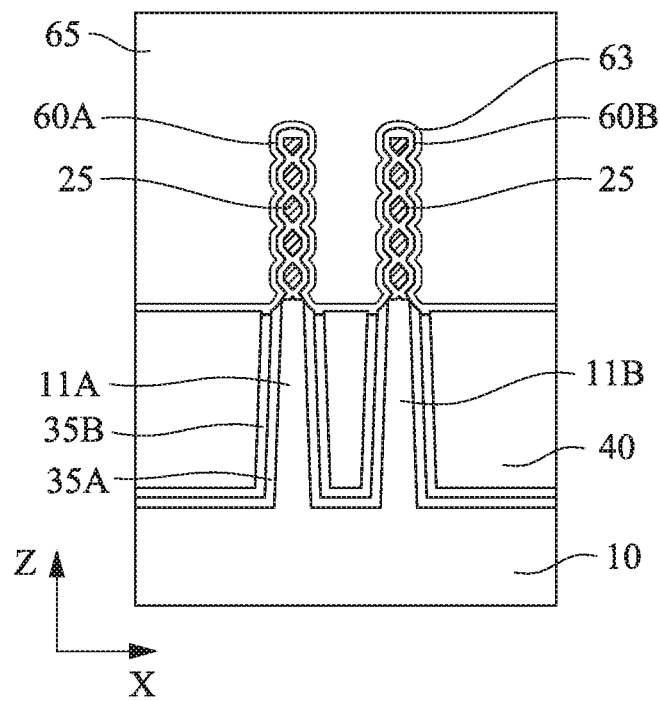
Figure 14F:
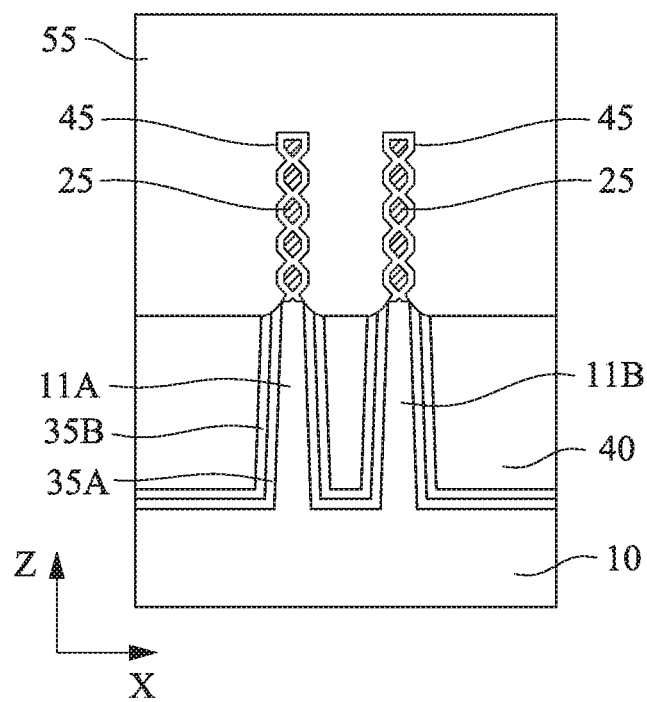

Subsequently, the p-channel region with the alloy semiconductor wires 27 is protected by a cover layer, and then the n-channel region is processed to expose the second semiconductor layers 25 in the channel region. Then, the cover layer of the p-channel region is removed, thereby obtaining the structure, as shown in FIGS. 14A-14F. FIG. 14A shows a perspective view, FIG. 14B shows a cross sectional view along the X direction cutting the channel region, FIG. 14C shows a cross sectional view along the Y direction cutting fin structure 30A, FIG. 14D shows a cross sectional view along the Y direction cutting fin structure 30B, FIG. 14E shows a cross sectional view along the X direction cutting the source/drain region, and FIG. 14F shows a cross sectional view along the X direction cutting the gate sidewall spacer 55. As shown in FIGS. 14B-14F, at the source/drain region and under the gate sidewall spacers, the second semiconductor layer 25 remain.

Figure 15E:
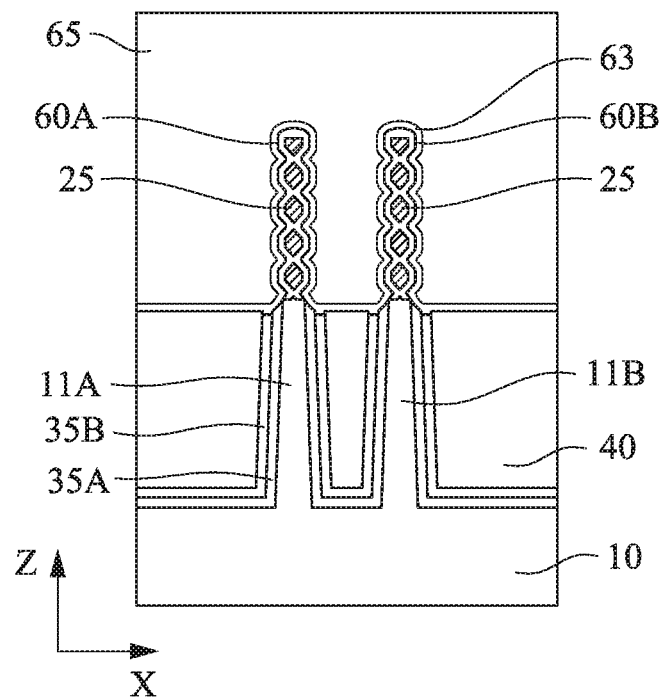
Figure 15F:
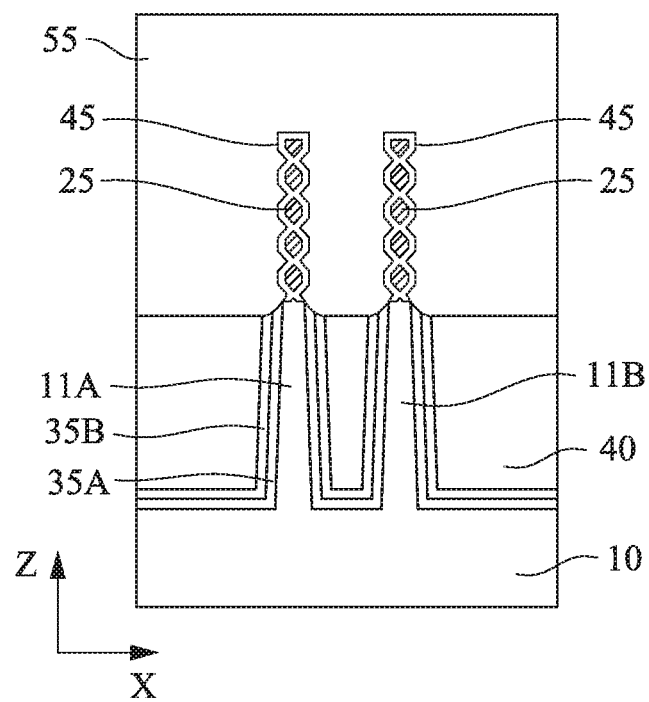

After the wires of the second semiconductor layers 25 are exposed in the p-channel region and the n-channel region, a gate dielectric layer 104 is formed around the wires of the second semiconductor layer 25, as shown in FIGS. 15A-15F, similar to FIGS. 11A-11G. FIG. 15A shows a perspective view, FIG. 15B shows a cross sectional view along the X direction cutting the channel region, FIG. 15C shows a cross sectional view along the Y direction cutting fin structure 30A, FIG. 15D shows a cross sectional view along the Y direction cutting fin structure 30B, FIG. 15E shows a cross sectional view along the X direction cutting the source/drain region, and FIG. 15F shows a cross sectional view along the X direction cutting the gate sidewall spacer 55.

Figure 16A:
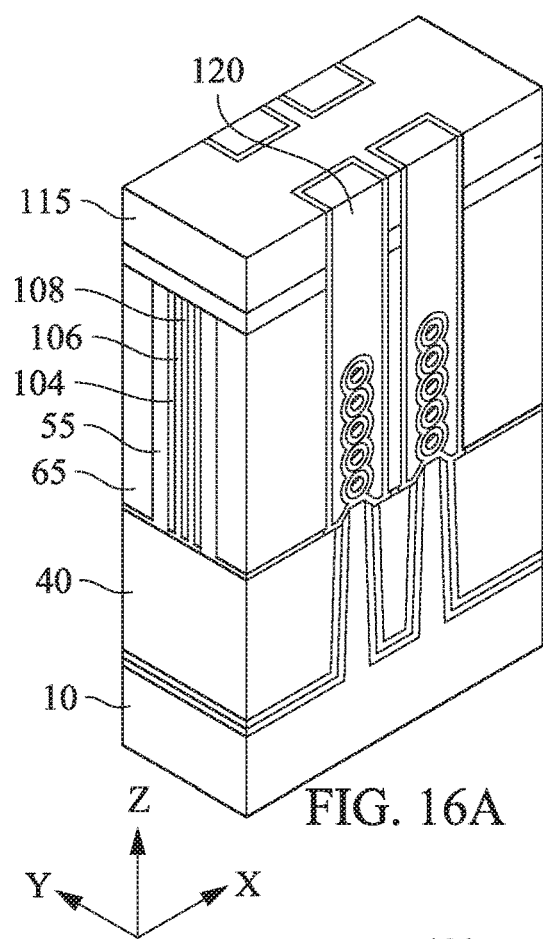
FIGS. 16A, 16B, 16C, 16D and 16E show various views of one of the various stages of a sequential manufacturing process for a GAA FET device according to another embodiment of the present disclosure.
Figure 16B:
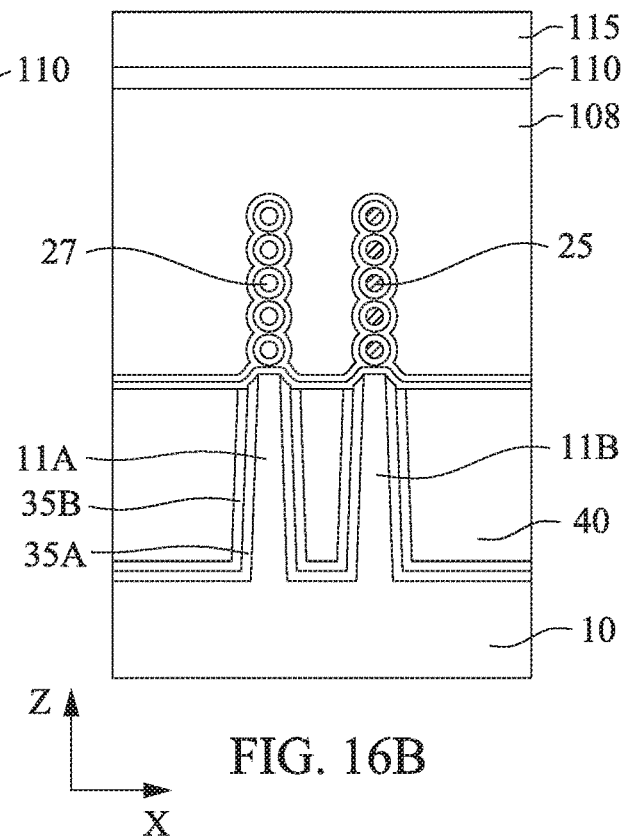
Figure 16C:
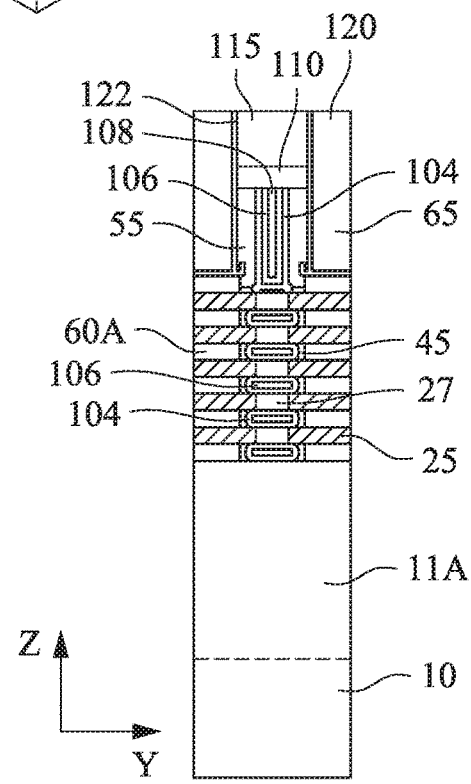
Figure 16D:
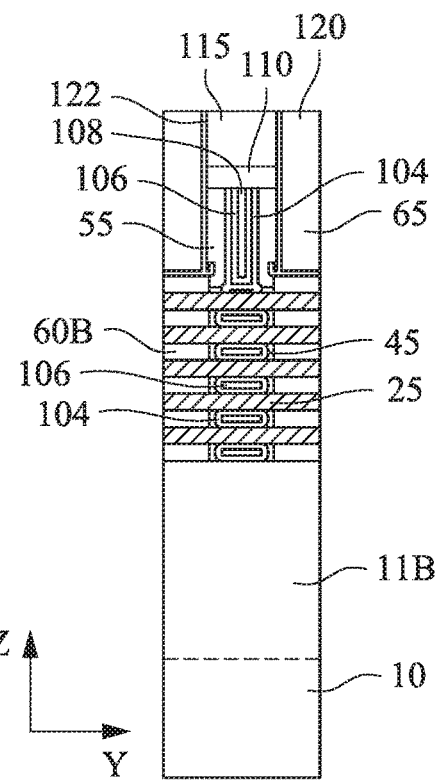
Figure 16E:
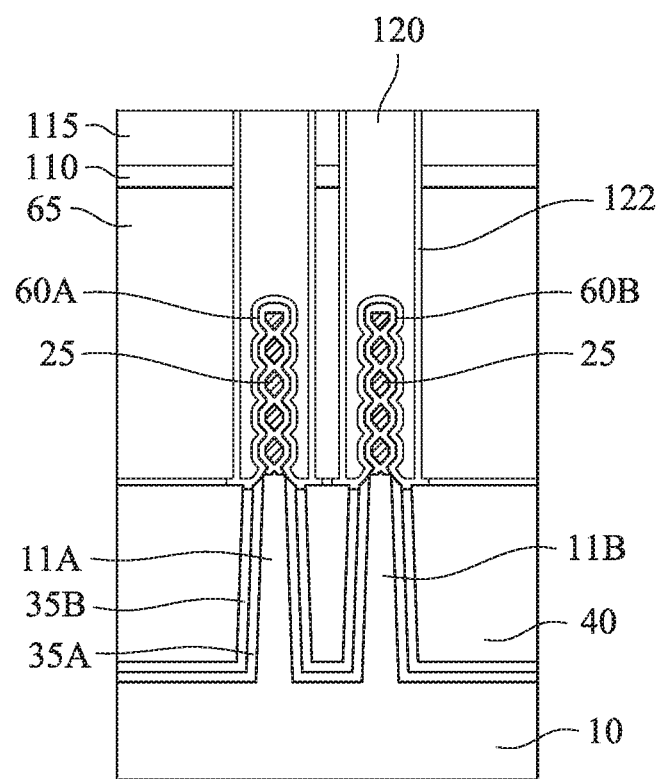

Subsequently, similar to FIGS. 12A-12E, source/drain contacts 120 are formed as shown in FIGS. 16A-16E. FIG. 16A shows a perspective view, FIG. 16B shows a cross sectional view along the X direction cutting the channel region, FIG. 16C shows a cross sectional view along the Y direction cutting fin structure 30A, FIG. 16D shows a cross sectional view along the Y direction cutting fin structure 30B, and FIG. 16E shows a cross sectional view along the X direction cutting the source/drain region.

In some embodiments, under the gate sidewall spacers 55, the oxide layer 45 wraps around Si portion of the semiconductor wires 25.

It is understood that the GAA FETs undergo further CMOS processes to form various features such as contacts/vias, interconnect metal layers, dielectric layers, passivation layers, etc.

FIGS. 17A-19E show a sequential process for manufacturing a GAA FET device according to another embodiment of the present disclosure. It is understood that additional operations can be provided before, during, and after processes shown by FIGS. 17A-19E, and some of the operations described below can be replaced or eliminated, for additional embodiments of the method. The order of the operations/processes may be interchangeable.

Figure 17A:
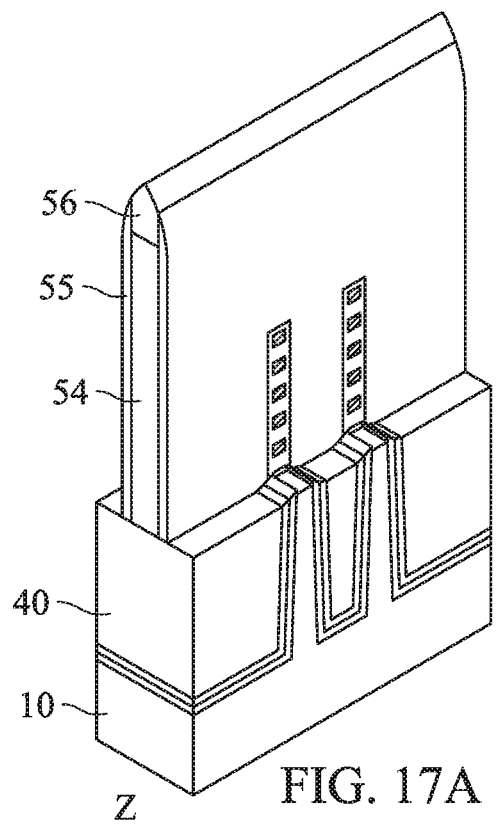
FIGS. 17A, 17B, 17C and 17D show various views of one of the various stages of a sequential manufacturing process for a GAA FET device according to another embodiment of the present disclosure.
Figure 17B:
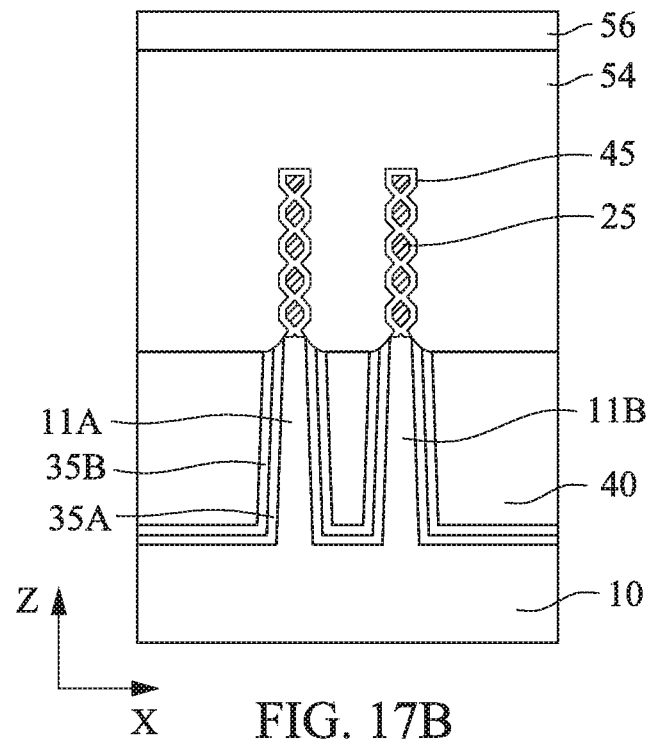
Figure 17C:
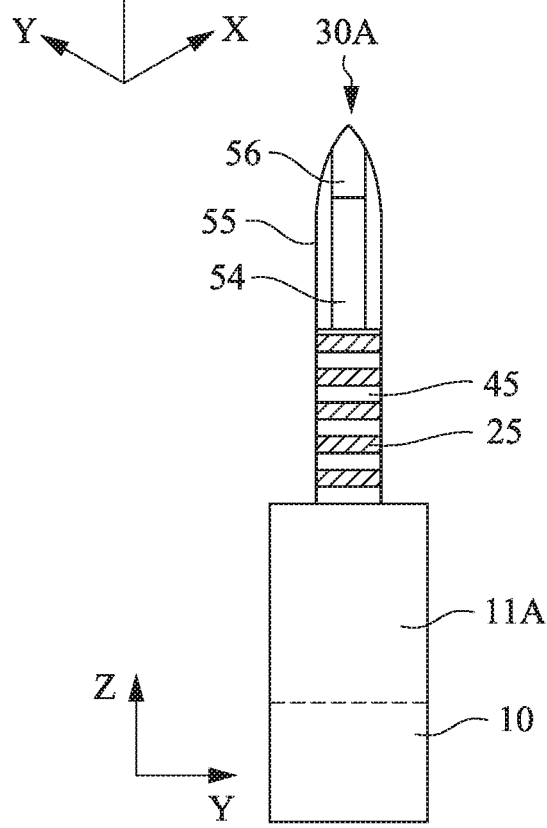
Figure 17D:
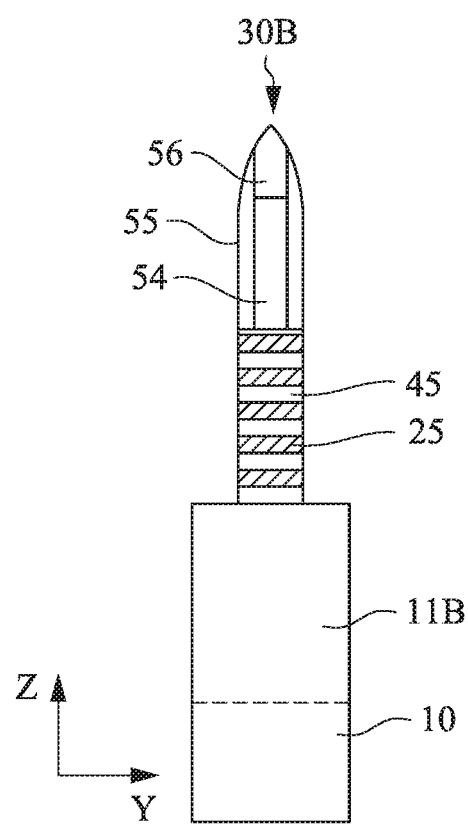

After the structure shown in FIGS. 8A-8D is formed, the source/drain regions of the fin structures including the second semiconductor layer 25 and the oxide layer 45 are removed, as shown in FIGS. 17A-17D. FIG. 17A shows a perspective view, FIG. 17B shows a cross sectional view along the X direction cutting the channel region, FIG. 17C shows a cross sectional view along the Y direction cutting fin structure 30A, and FIG. 17D shows a cross sectional view along the Y direction cutting fin structure 30B.

Figure 18A:
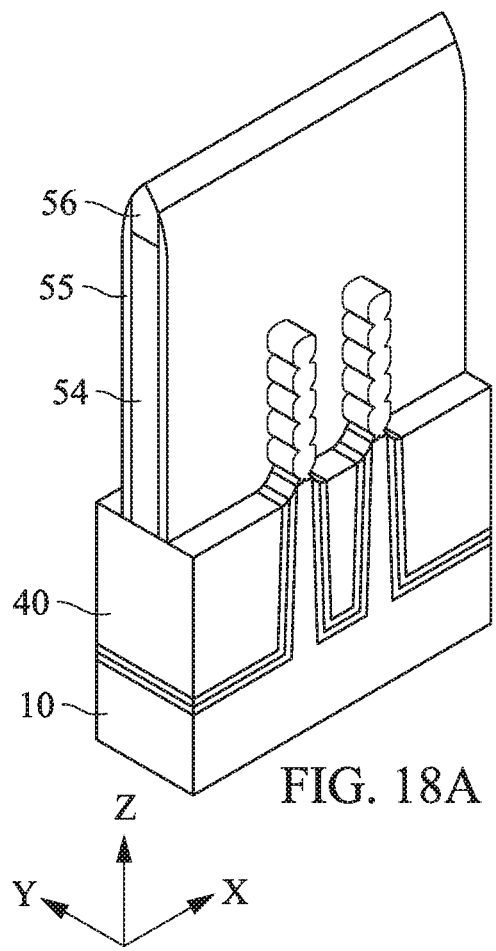
FIGS. 18A, 18B, 18C and 18D show various views of one of the various stages of a sequential manufacturing process for a GAA FET device according to another embodiment of the present disclosure.
Figure 18B:
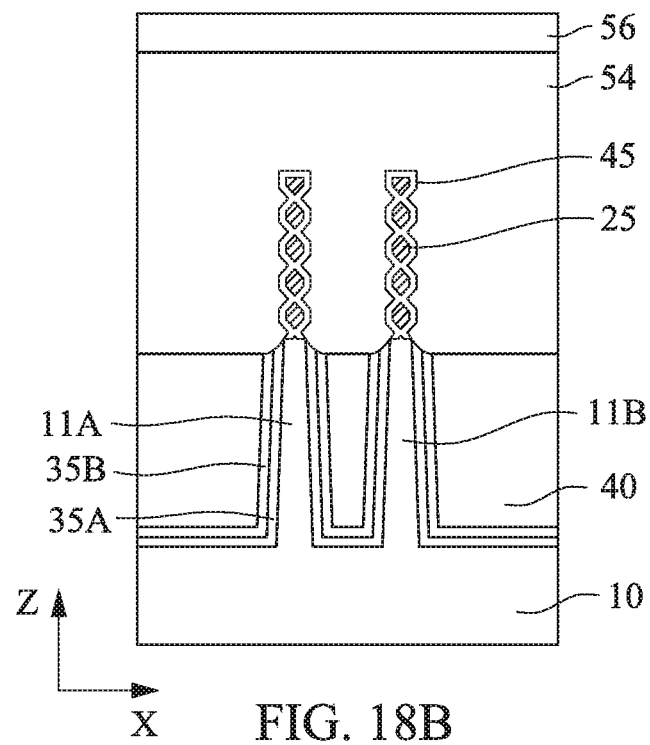
Figure 18C:
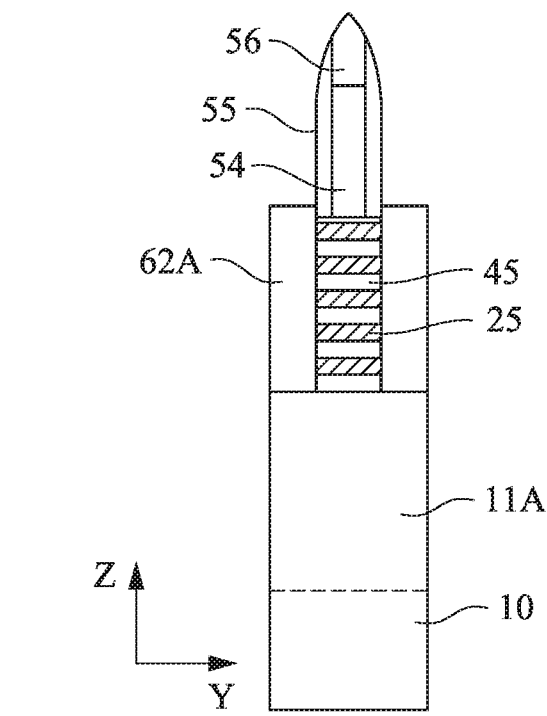
Figure 18D:
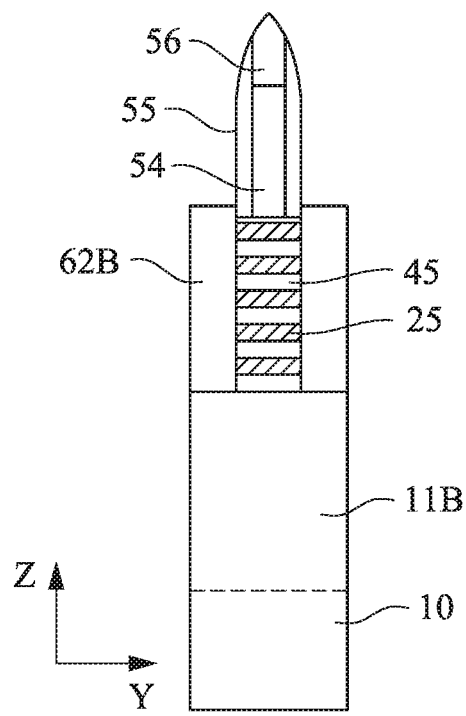

Next, as shown in FIGS. 18A-18D, source/drain epitaxial layers 62A and 62B are formed. FIG. 18A shows a perspective view, FIG. 18B shows a cross sectional view along the X direction cutting the sacrificial gate structure 50, FIG. 18C shows a cross sectional view along the Y direction cutting fin structure 30A, and FIG. 18D shows a cross sectional view along the Y direction cutting fin structure 30B.

The first S/D epitaxial layer 62A is formed on end faces of the second semiconductor layers 25 in the S/D region of the fin structure 30A. The first S/D epitaxial layer 62A includes one or more layers of Si, SiGe and SiGeP for a p-channel FET. The first S/D epitaxial layer 62A is formed by an epitaxial growth method using CVD, ALD or molecular beam epitaxy (MBE). In some embodiments, boron (B) is contained in the first S/D epitaxial layer 62A. The second S/D epitaxial layer 62B is formed on end faces of the second semiconductor layers 25 in the S/D region of the fin structure 35B. The second S/D epitaxial layer 62B includes one or more layers of Si, SiP, SiC and SiCP for an n-channel FET. The second S/D epitaxial layer 62B is formed by an epitaxial growth method using CVD, ALD or molecular beam epitaxy (MBE). In some embodiments, the first source/drain (S/D) epitaxial layer 62A for a p-channel FET and the second S/D epitaxial layer 62B for an n-channel FET are separately formed.

Figure 19A:
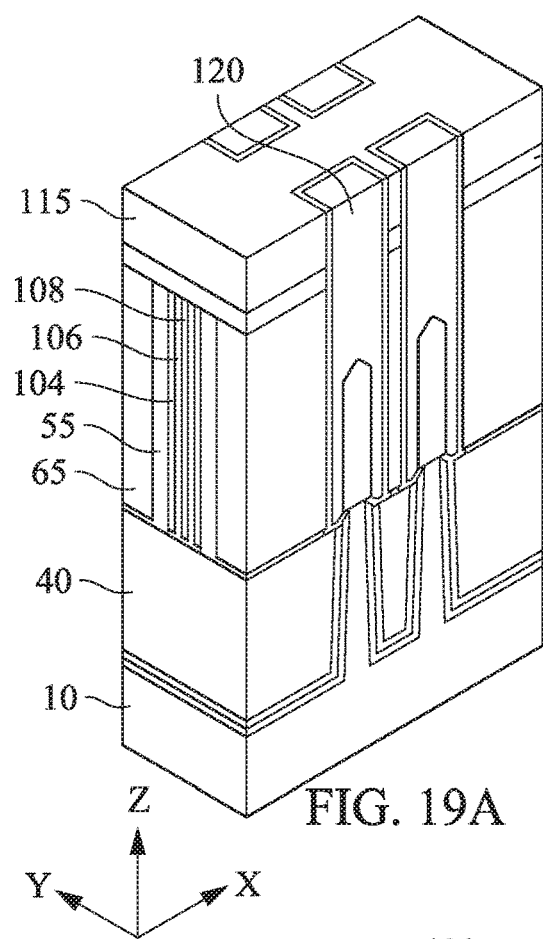
FIGS. 19A, 19B, 19C, 19D and 19E show various views of one of the various stages of a sequential manufacturing process for a GAA FET device according to another embodiment of the present disclosure.
Figure 19B:
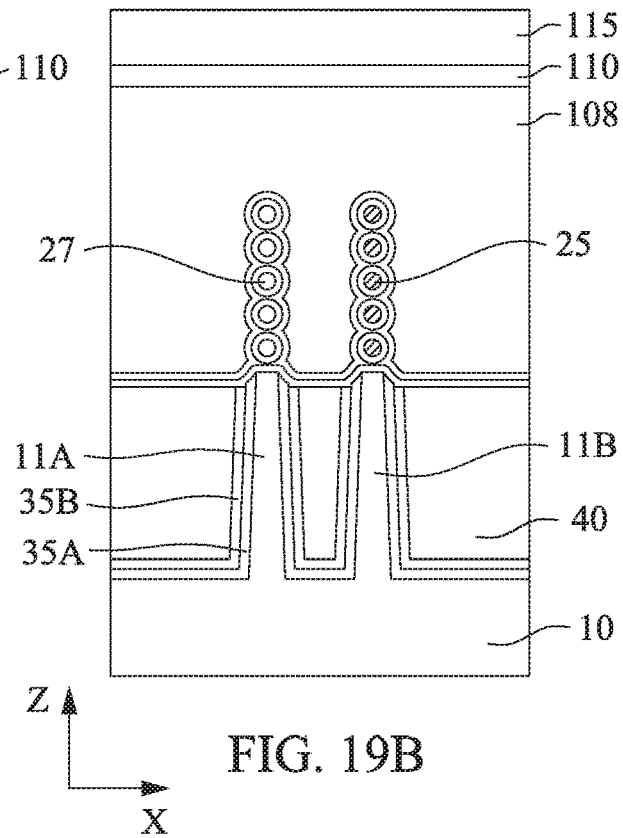
Figure 19C:
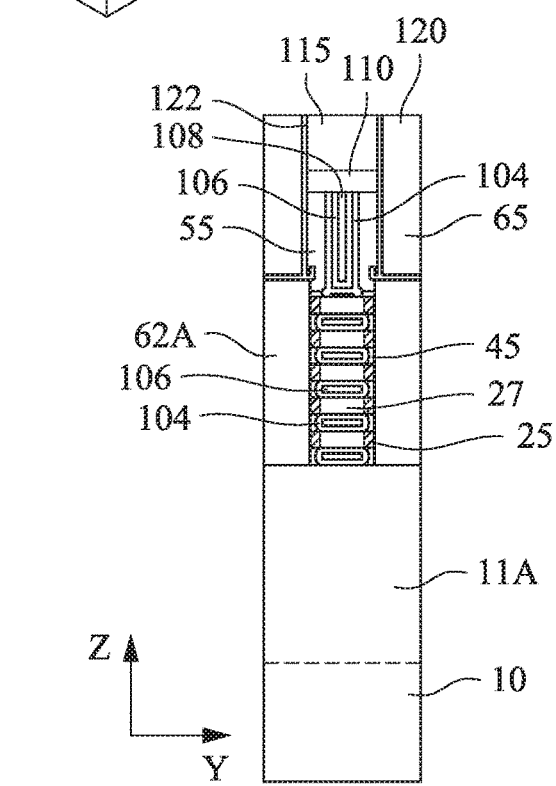
Figure 19D:
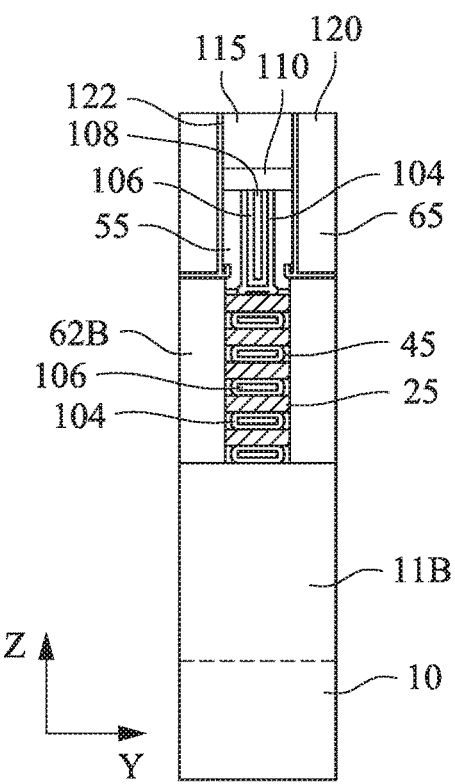
Figure 19E:
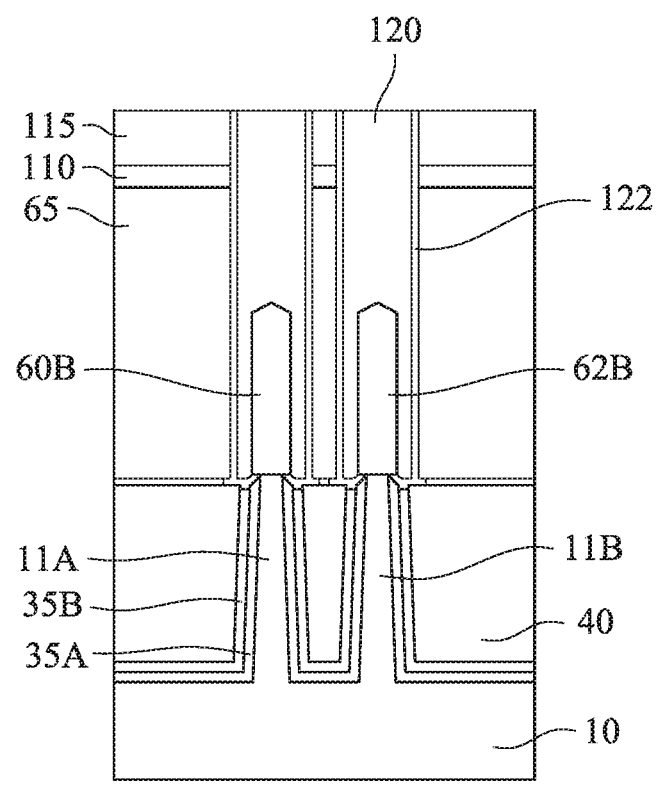

Subsequently, by the same or similar operations with respect to FIGS. 10A-12E, source/drain contacts 120 are formed as shown in FIGS. 19A-19E. FIG. 19A shows a perspective view, FIG. 19B shows a cross sectional view along the X direction cutting the channel region, FIG. 19C shows a cross sectional view along the Y direction cutting fin structure 30A, FIG. 19D shows a cross sectional view along the Y direction cutting fin structure 30B, and FIG. 19E shows a cross sectional view along the X direction cutting the source/drain region.

It is understood that the GAA FETs undergo further CMOS processes to form various features such as contacts/vias, interconnect metal layers, dielectric layers, passivation layers, etc.

Figure 20A:
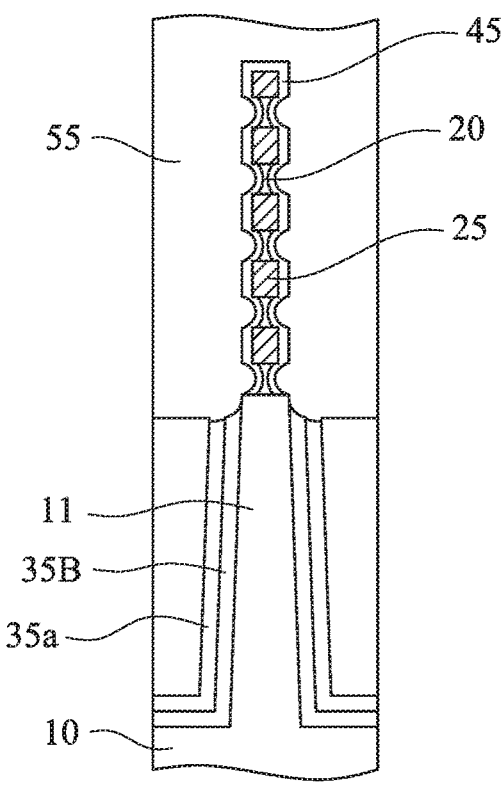
FIGS. 20A, 20B, 20C, and 20D show various views of GAA FET devices according to embodiments of the present disclosure.

FIGS. 20A-20D show various structures of the fin structure under the gate sidewall spacers 55. In some embodiments, in the oxidation process of the first semiconductor layer 20, the first semiconductor layers 20 are not fully oxidized and part of the first semiconductor layers 20 remains. Thus, after the gate structure is formed, the remaining part of the first semiconductor layers 20 exists under the gate sidewall spacers 55, as shown in FIG. 20A. The oxide layer 45 is continuously disposed on side faces of the second semiconductor layer 25 and the remaining first semiconductor layers 20.

Figure 20B:
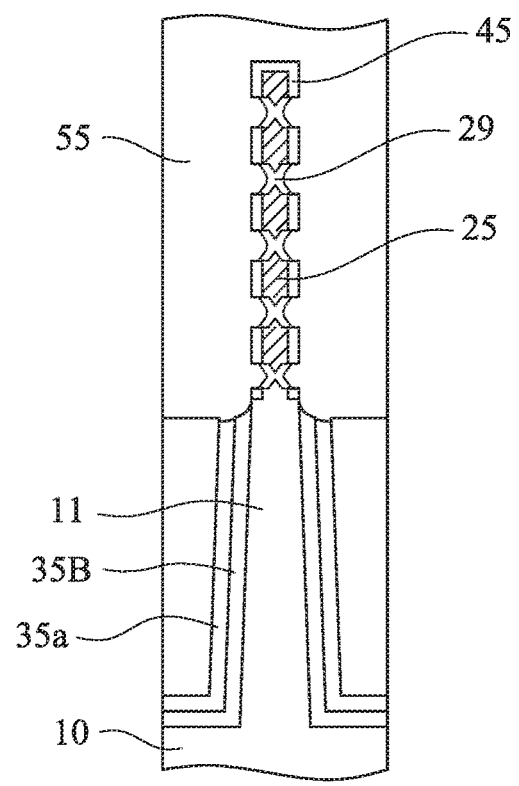

In other embodiments, when the oxide layer 45 is removed in the gate space, the oxide layer between the second semiconductor layers 25 is substantially fully removed. Thus, after the gate structure is formed, air gaps 29 are formed between the second semiconductor layers under the gate sidewall spacers 55, as shown in FIG. 20B. The oxide layer 45 is discontinuously disposed on side faces of the second semiconductor layer 25.

Figure 20C:
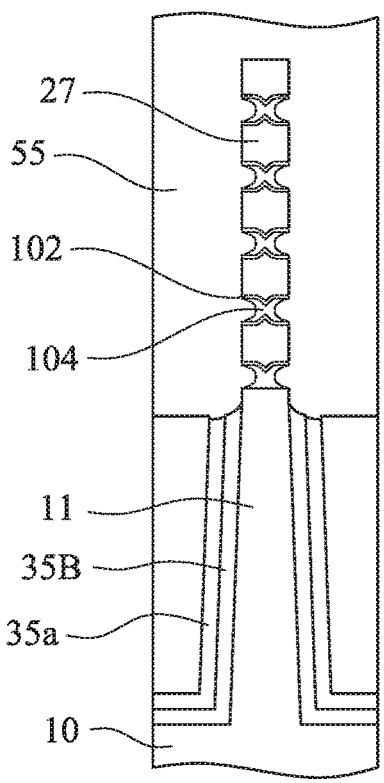
Figure 20D:
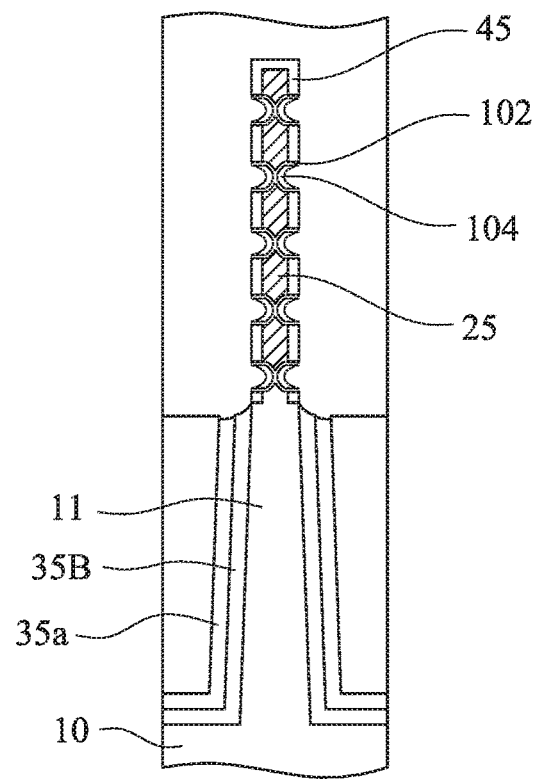

Further, in some embodiments, the air gaps are filled with one or more dielectric material, as shown in FIG. 20C. In certain embodiments, the interfacial layer 102 is formed on upper and lower faces of the second semiconductor layers 25 or the alloy semiconductor layers 27 and the gate dielectric layer 104 fills the spaces between the interfacial layer 102 as shown in FIG. 20C. In other embodiments, as shown in FIG. 20D, the interfacial layer 102 connects the adjacent second semiconductor layers 25 and the gate dielectric layer 104 is formed on the interfacial layer 102. The oxide layer 45 is discontinuously disposed on side faces of the second semiconductor layer 25.

The various embodiments or examples described herein offer several advantages over the existing art. For example, the inner spacers can be formed in a self-aligned manner. In addition, Si nano-wire channels and SiGe nano-wire channels are formed by a single channel epitaxy process. Thus, it is possible to improve the performances of the GAA FETs and to reduce manufacturing cost.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure having a lower fin structure and an upper fin structure disposed over the lower fin structure is formed. The upper fin structure includes first semiconductor layers and second semiconductor layers alternately stacked. The first semiconductor layers are partially etched to reduce widths of the first semiconductor layers. An oxide layer is formed over the upper fin structure. A sacrificial gate structure is formed over the upper fin structure with the oxide layer. A source/drain epitaxial layer is formed over a source/drain region of the fin structure. The sacrificial gate structure is removed to form a gate space. The oxide layer is removed to expose the second semiconductor layers in the gate space. A gate structure is formed around the second semiconductor layers in the gate space. In one or more of the foregoing and the following embodiments, the oxide layer is formed by thermal oxidation. In one or more of the foregoing and the following embodiments, after the thermal oxidation, an annealing operation is performed. In one or more of the foregoing and the following embodiments, the annealing operation is performed at 800° C. to 1000° C. In one or more of the foregoing and the following embodiments, the etched first semiconductor layers are fully oxidized by the thermal oxidation. In one or more of the foregoing and the following embodiments, the etched first semiconductor layers are partially oxidized by the thermal oxidation. In one or more of the foregoing and the following embodiments, after the oxide layer is removed in the gate space, the first semiconductor layers are removed in the gate space. In one or more of the foregoing and the following embodiments, before the source/drain epitaxial layer is formed, the oxide layer in the source/drain region is removed. In one or more of the foregoing and the following embodiments, the source/drain epitaxial layer wraps around the second semiconductor layers in the source/drain region. In one or more of the foregoing and the following embodiments, part of the oxide layer remains between the source/drain epitaxial layer and the gate structure. In one or more of the foregoing and the following embodiments, an isolation insulating layer is formed around the lower fin structure after the first semiconductor layers are partially etched. In one or more of the foregoing and the following embodiments, the sacrificial gate structure includes a sacrificial gate electrode, and the sacrificial gate electrode is in contact with the oxide layer. In one or more of the foregoing and the following embodiments, the first semiconductor layers are made of SiGe and the second semiconductor layers are made of Si.

In accordance with another aspect of the present disclosure, in a method of manufacturing a semiconductor device, a fin structure having a lower fin structure and an upper fin structure disposed over the lower fin structure is formed. The upper fin structure includes first semiconductor layers and second semiconductor layers alternately stacked. The first semiconductor layers are partially etched to reduce widths of the first semiconductor layers. An oxide layer is formed over the upper fin structure. A sacrificial gate structure is formed over the upper fin structure with the oxide layer. A source/drain epitaxial layer is formed over a source/drain region of the fin structure. The sacrificial gate structure is removed to form a gate space. The oxide layer is removed in the gate space to expose the second semiconductor layers in the gate space. A third semiconductor layer is formed on each of the exposed second semiconductor layers. Channel wires are formed by mixing the third semiconductor layer and the second semiconductor layer. A gate structure is formed around the channel wires in the gate space. In one or more of the foregoing and the following embodiments, the first semiconductor layers are made of SiGe, the second semiconductor layers are made of Si, and the third semiconductor layer is made of SiGe or Ge. In one or more of the foregoing and the following embodiments, the oxide layer is formed by thermal oxidation. In one or more of the foregoing and the following embodiments, the etched first semiconductors are fully oxidized by the thermal oxidation. In one or more of the foregoing and the following embodiments, part of the oxide layer remains between the source/drain epitaxial layer and the gate structure.

In accordance with another aspect of the present disclosure, in a method of manufacturing a semiconductor device, a fin structure having a lower fin structure and an upper fin structure disposed over the lower fin structure is formed. The upper fin structure includes first semiconductor layers and second semiconductor layers alternately stacked. The first semiconductor layers are partially removed to reduce widths of the first semiconductor layers. An oxide layer is formed over the upper fin structure. A sacrificial gate structure is formed over the upper fin structure with the oxide layer. A source/drain region of the upper fin structure, which is not covered by the sacrificial gate structure, is removed. A source/drain epitaxial layer is formed to contact the second semiconductor layers. The sacrificial gate structure is removed to form a gate space. The oxide layer is removed to expose the second semiconductor layers in the gate space. A gate structure is formed around the second semiconductor layers in the gate space. In one or more of the foregoing and the following embodiments, part of the oxide layer remains between the source/drain epitaxial layer and the gate structure.

In accordance with one aspect of the present disclosure, a semiconductor device includes a lower fin structure disposed over a substrate, semiconductor wires disposed over the lower fin structure, a gate structure disposed over channel regions of the semiconductor wires, gate sidewall spacers disposed on opposite side faces of the gate structure, and a source/drain epitaxial layer. An dielectric layer made of a different material than the gate sidewall spacers wraps around the semiconductor wires under the gate sidewall spacers. In one or more of the foregoing and the following embodiments, the gate sidewall spacers are made of a silicon nitride based material and the dielectric layer is made of an oxide of at least one of Si and Ge. In one or more of the foregoing and the following embodiments, under the gate sidewall spacers, at least one of the semiconductor wires has a cross section having two vertical sides, a V-shape bottom side and a reverse V-shape top side. In one or more of the foregoing and the following embodiments, under the gate sidewall spacers, at least one of the semiconductor wires has a cross section having two vertical sides, a upwardly protruding top side and a downwardly protruding bottom side.

In one or more of the foregoing and the following embodiments, an uppermost one of the semiconductor wires has a different cross section than remaining ones of the semiconductor wires. In one or more of the foregoing and the following embodiments, under the gate sidewall spacers, the uppermost one of the semiconductor wires has a cross section having two vertical sides, a flat top side and a downwardly protruding bottom side, and the remaining ones of the semiconductor wires have a cross section having two vertical sides, a upwardly protruding top side and a downwardly protruding bottom side. In one or more of the foregoing and the following embodiments, the dielectric layer is disposed between the source/drain epitaxial layer and a gate dielectric layer of the gate structure. In one or more of the foregoing and the following embodiments, the source/drain epitaxial layer wraps around source/drain regions of the semiconductor wires. In one or more of the foregoing and the following embodiments, the source/drain epitaxial layer is in contact with lateral end faces of the semiconductor wires. In one or more of the foregoing and the following embodiments, the channel regions of the semiconductor wires are made of a first semiconductor material and source/drain regions of the semiconductor wires are made of a second semiconductor material different from the first semiconductor material. In one or more of the foregoing and the following embodiments, the first semiconductor material is SiGe and the second semiconductor material is Si. In one or more of the foregoing and the following embodiments, under the gate sidewall spacers, the dielectric layer wraps around portion of the semiconductor wires made of the second material. In one or more of the foregoing and the following embodiments, the dielectric layer includes a silicon-germanium oxide portion and a silicon oxide portion. In one or more of the foregoing and the following embodiments, under the gate sidewall spacers, the silicon-germanium oxide portion is disposed between adjacent semiconductor wires. In one or more of the foregoing and the following embodiments, under the gate sidewall spacers, the silicon oxide portion is disposed on side faces of the semiconductor wires.

In accordance with another aspect of the present disclosure, a semiconductor device includes a lower fin structure disposed over a substrate, semiconductor wires disposed over the lower fin structure, a gate structure disposed over channel regions of the semiconductor wires, gate sidewall spacers disposed on opposite side faces of the gate structure, and a source/drain epitaxial layer. An dielectric layer made of a different material than the gate sidewall spacers are disposed on side faces of the semiconductor wires under the gate sidewall spacers. In one or more of the foregoing and the following embodiments, air gaps are disposed between adjacent semiconductor wires under the gate sidewall spacers. In one or more of the foregoing and the following embodiments, one or more layers of dielectric materials are disposed between adjacent semiconductor wires under the gate sidewall spacers. In one or more of the foregoing and the following embodiments, at least one of the one or more layers of dielectric materials is a high-k dielectric material.

In accordance with another aspect of the present disclosure, a semiconductor device includes a lower fin structure disposed over a substrate, semiconductor wires disposed over the lower fin structure, a gate structure disposed over channel regions of the semiconductor wires, gate sidewall spacers disposed on opposite side faces of the gate structure, and a source/drain epitaxial layer. An dielectric layer made of a different material than the gate sidewall spacers are disposed on side faces of the semiconductor wires under the gate sidewall spacers, and a semiconductor material different from the semiconductor wires are disposed between adjacent semiconductor wires under the gate sidewall spacers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure having a lower fin structure and an upper fin structure disposed over the lower fin structure, the upper fin structure including first semiconductor layers and second semiconductor layers alternately stacked;
    partially etching the first semiconductor layers to reduce widths of the first semiconductor layers;
    after the partially etching the first semiconductor layers before forming a sacrificial gate structure, forming an oxide layer over the upper fin structure;
    forming the sacrificial gate structure to cover the upper fin structure on which the oxide layer is formed;
    after the sacrificial gate structure is formed, removing the oxide layer from the second semiconductor layers that laterally protrude from a side of the sacrificial gate structure;
    forming a source/drain epitaxial layer to wrap around each of the second semiconductor layers from which the oxide layer is removed;
    removing the sacrificial gate structure to form a gate space;
    removing the remaining oxide layer to expose the second semiconductor layers in the gate space; and
    forming a gate structure around the second semiconductor layers in the gate space.

2. The method of claim 1, wherein the oxide layer is formed by thermal oxidation.

3. The method of claim 2, wherein after the thermal oxidation, an annealing operation is performed.

4. The method of claim 3, wherein the annealing operation is performed at 800° C. to 1000° C.

5. The method of claim 2, wherein the etched first semiconductor layers are fully oxidized by the thermal oxidation.

6. The method of claim 2, wherein the etched first semiconductor layers are partially oxidized by the thermal oxidation.

7. The method of claim 6, wherein after the oxide layer is removed in the gate space, the first semiconductor layers are removed in the gate space.

8. The method of claim 1, wherein part of the oxide layer remains between the source/drain epitaxial layer and the gate structure.

9. The method of claim 1, further comprising forming an isolation insulating layer around the lower fin structure after the first semiconductor layers are partially etched.

10. The method of claim 1, wherein:
    the sacrificial gate structure includes a sacrificial gate electrode, and the sacrificial gate electrode is in contact with the oxide layer.

11. The method of claim 1, wherein the first semiconductor layers are made of SiGe and the second semiconductor layers are made of Si.

12. A method of manufacturing a semiconductor device, comprising:
    forming a fin structure having a lower fin structure and an upper fin structure disposed over the lower fin structure, the upper fin structure including first semiconductor layers and second semiconductor layers alternately stacked;
    partially etching the first semiconductor layers to reduce widths of the first semiconductor layers;
    after the partially etching the first semiconductor layers before forming a sacrificial gate structure, forming an oxide layer over the upper fin structure;
    forming the sacrificial gate structure to partially cover the upper fin structure on which the oxide layer is formed;
    after the sacrificial gate structure is formed, removing the oxide layer from the second semiconductor layers that laterally protrude from a side of the sacrificial gate structure;
    forming a source/drain epitaxial layer to wrap around each of the second semiconductor layers from which the oxide layer is removed;
    removing the sacrificial gate structure to form a gate space;
    removing the remaining oxide layer in the gate space to expose the second semiconductor layers in the gate space;
    forming a third semiconductor layer on each of the exposed second semiconductor layers;
    forming channel wires, the channel wires being an alloy of the third semiconductor layer and the second semiconductor layer; and
    forming a gate structure around the channel wires in the gate space.

13. The method of claim 12, wherein:
    the first semiconductor layers are made of SiGe,
    the second semiconductor layers are made of Si, and
    the third semiconductor layer is made of SiGe or Ge.

14. The method of claim 12, wherein the oxide layer is formed by thermal oxidation.

15. The method of claim 12, wherein the etched first semiconductors are fully oxidized by the thermal oxidation.

16. The method of claim 12, wherein part of the oxide layer remains between the source/drain epitaxial layer and the gate structure.

17. The method of claim 12, wherein the alloy layer is formed by a thermal treatment at a temperature from 900° C. to 1100° C.

18. A method of manufacturing a semiconductor device, comprising:
    forming a fin structure having a lower fin structure and an upper fin structure disposed over the lower fin structure, the upper fin structure including first semiconductor layers and second semiconductor layers alternately stacked;
    partially etching the first semiconductor layers to reduce widths of the first semiconductor layers;
    after the partially etching the first semiconductor layers before forming a sacrificial gate structure, forming an oxide layer over the upper fin structure, wherein the etched first semiconductors are fully converted into oxide and the oxide layer covers the first semiconductor layers;

forming the sacrificial gate structure to partially cover the upper fin structure on which the oxide layer is formed;

removing the oxide layer from the second semiconductor layers that laterally protrude from a side of the sacrificial gate structure;

forming a source/drain epitaxial layer to wrap around each of the second semiconductor layers from which the oxide layer is removed;

removing the sacrificial gate structure to form a gate space;

removing the remaining oxide layer to exposed the second semiconductor layers in the gate space; and forming a gate structure around the second semiconductor layers in the gate space.

19. The method of claim 18, wherein part of the oxide layer remains between the source/drain epitaxial layer and the gate structure.

20. The method of claim 18, wherein the oxide layer is formed by a thermal oxidation process performed at a temperature in a range from 800° C. to 1000° C.

* * * * *